US007193485B2

(12) United States Patent
Dayton, Jr.

(10) Patent No.: US 7,193,485 B2
(45) Date of Patent: Mar. 20, 2007

(54) METHOD AND APPARATUS FOR BI-PLANAR BACKWARD WAVE OSCILLATOR

(75) Inventor: James A. Dayton, Jr., 10423 Lake Ave., Cleveland, OH (US) 44102

(73) Assignee: James A. Dayton, Jr., Cleveland, OH (US)

( * ) Notice: Subject to any disclaimer, the term of this patent is extended or adjusted under 35 U.S.C. 154(b) by 0 days.

(21) Appl. No.: 10/916,467

(22) Filed: Aug. 12, 2004

(65) Prior Publication Data

US 2005/0077973 A1 Apr. 14, 2005

Related U.S. Application Data

(60) Provisional application No. 60/494,089, filed on Aug. 12, 2003, provisional application No. 60/494,095, filed on Aug. 12, 2003.

(51) Int. Cl.
*H03B 1/00* (2006.01)

(52) U.S. Cl. .......................... 331/177 V; 331/117 FE; 331/117 R; 331/36 C; 331/185; 331/167

(58) Field of Classification Search .................. 331/79, 331/82, 36 C, 117 V, 185, 117 FE, 167, 117 R; 315/5, 5.41
See application file for complete search history.

(56) References Cited

U.S. PATENT DOCUMENTS 2,880,355 A 3/1959 Epsztein
2,888,597 A 5/1959 Dohler et al.
2,932,760 A 4/1960 Epsztein
3,787,747 A 1/1974 Scott
4,149,107 A 4/1979 Guenard
4,459,562 A 7/1984 Kosmahl
4,820,688 A * 4/1989 Jasper, Jr. .................. 505/200
6,242,740 B1 6/2001 Luukanen et al.
6,584,675 B1 7/2003 Rajan et al.
6,700,454 B2 * 3/2004 Yaniv et al. .................. 333/1
6,917,162 B2 7/2005 Dayton, Jr.

OTHER PUBLICATIONS

"Submillimeter Backward-Wave Oscillator," L. Barnett, N. Stankiewicz, V. Heinen, and J. Dayton, Jr., IEEE International Electron Devices Meeting, San Francisco, CA, Dec. 1990.
"Accurate Cold-Test Model of Helical TWT Slow-Wave Circuits," C. Kory and J. A. Dayton, Jr., IEEE Trans. ED, vol. 45, No. 4, pp. 966-971 (Apr. 1998).
"Effect of Helical Slow-Wave Circuit Variations on TWT Cold-Test Characteristics," C. Kory and J. A. Dayton, Jr., IEEE Trans ED, vol. 45, No. 4, pp. 972-976 (Apr. 1998).
"First Pass TWT Design Success," R. T. Benton, C. K. Chong, W. Menninger, C. B. Thorington, X. Zhai, D. S. Komm and J. Dayton, Jr., IEEE Trans. ED, vol. 48, No. 1, pp. 176-178 (Jan. 2001).

(Continued)

*Primary Examiner*—Arnold Kinkead
(74) *Attorney, Agent, or Firm*—Duane Morris, LLP

(57) ABSTRACT

The disclosure relates to a sub-millimeter backward wave oscillator. More specifically, the disclosure relates to a miniature backward wave oscillator having a biplanar interdigital circuit. In one embodiment the interdigital circuit includes diamond and is coated with an electro-conductive material.

27 Claims, 32 Drawing Sheets

OTHER PUBLICATIONS

C. Kory and J. A. Dayton, Jr., "Computational Investigation of Experimental Interaction Impedance Obtained by Perturbation for Helical Traveling-Wave Tube Structures," IEEE Transactions on Electron Devices, vol. 45, No. 9, p. 2063, Sep. 1998.

"Principles of Traveling Wave Tubes," A. S. Gilmour, Jr., p. 17-45, Artech House, 1999.

"Principles of Electron Tubes," W. Gewartowski and H. A. Watson, Chapter 11, D. Van Nostrand Company, Inc, New Jersey, 1965, pp. 398-421.

"Backward Wave Oscillator Efficiency," R. W. Grow and D. A. Watkins, Proc. IRE, Jul. 1955, pp. 848-856.

"SLAC-166," W. B. Herrmannsfeldt, Stanford Linear Accelerator Center, 1973.

"Field-emitter-array Development for Microwave Applications," C. Spindt, C. Holland, P. Schwoebel and I. Brodie, Journal of Vacuum Science and Technology, Part B, vol. 14, No. 3, pp. 1986-1989, 1996.

"Field Emitter Arrays for Plasma and Microwave Source Applications," K. Jensen, Physics of Plasmas, vol. 6, No. 5, pp. 2241-2253, May 1999.

"Application of Field Emitter Arrays to Microwave Power Amplifiers," D. R. Whaley, B. M. Gannon, C. R. Smith, C. M. Armstrong and C. A. Spindt, IEEE Trans. Plasma Science, vol. 28, No. 3, pp. 727-747, Jun. 2000.

"Offset Printing of Gasket Seals for Microdisplay Applications," D. J. Davis, J. Gandhi, R. Klouda, Y. Ji, and M. E. Stefanov, International Display Manufacturing Conference, Sep. 2000, Seoul, Korea.

* cited by examiner

Fig. 5 – Effect of beam Tunnel Height (ygap) on interaction impledence

2700

METHOD AND APPARATUS FOR BI-PLANAR BACKWARD WAVE OSCILLATOR

CLAIM OF PRIORITY

The instant application claims the benefit of the filing date of application Ser. No. 10/772,444 filed Feb. 6, 2004; Provisional Application Nos. 60/494,089 and 60/494,095 filed Aug. 12, 2003. Each of the above-identified Applications is incorporated herein in its entirety.

BACKGROUND

A backward wave oscillator (BWO) is a tunable source of coherent radiation. In a conventional backward oscillator an electron gun sends a beam of electrons into a slow-wave structure. The output power of the electron beam is extracted near the electron gun. Because of their wide tuning range, the backward wave oscillators have been used in a variety of applications including as local oscillators in heterodyne receivers for the detection of sub mm radiation.

Nominally, the sub mm wave regime ranges from 300 to 3000 GHz where electromagnetic radiation has a wavelength between 1.0 and 0.1 mm. Above the sub mm band is the infrared region where wavelengths are typically reported in microns and the electromagnetic waves behave similar to light waves. Below the sub mm band is the mm wave band (ranging from 30 to 300 GHz) and the microwave band (ranging from 1 to 30 GHz). In the mm and microwave bands, the electromagnetic waves behave similar to the ordinary low frequency electric currents and voltages with the very important distinction that the circuit dimensions are comparable to a wavelength. In the sub mm band, electromagnetic radiation has the properties of both microwaves and light. Structures that are suitable for microwaves become unreasonably small for sub mm devices while standard optical configurations become far too large.

Added to the dimensional complexity are several physical constraints in the sub mm band imposed by significant atmospheric attenuation and by greatly increased electrical conduction losses. Atmospheric attenuation is greatly enhanced by the presence of vibrational and rotational resonances of naturally occurring molecular gasses, while the roughness of metal surfaces significantly increases conduction losses. Because many of the issues regarding size and losses become exceedingly important at frequencies well below 300 GHz, the sub mm regime is frequently extended to 100 GHz.

Conventionally, vacuum electron devices have dominated the microwave and mm wave regimes for applications where power and efficiency are important system parameters. However, within the sub mm regime, conventional microwave structures are usually not applicable. Solid state devices are used as low power signal sources in the microwave and low mm wave regimes, but are not applicable in the sub mm band. Gas lasers can be operated in the sub mm band, but they can only be tuned to discrete frequencies and they are generally very large devices. Presently, there is no commercially available electronically tunable signal source in the sub mm band.

Therefore, an object of the instant disclosure is to provide a BWO having an interdigital slow-wave circuit.

Another object is to provide a BWO comprising diamond.

Still another object of the disclosure is to provide a novel spatial relationship between the electron beam of a BWO and the slow-wave circuit.

Another object of the disclosure is to provide a BWO having an interaction impedance of greater than 1, preferably greater than 10 and most preferably greater than 100.

A further object of the disclosure is to provide a miniature BWO weighing less than 10 kg and preferably less than 1 kg.

A still further object of the disclosure is to provide an interdigital circuit for use in a BWO.

Still another object of the disclosure is to provide a BWO structure integrated with an electron source.

A further object of the disclosure is to provide a coupling interface between an electron source and the BWO.

Another object of the disclosure is to provide an integrated BWO having field emission cathode as an electron source.

A still further object of the disclosure is to provide a BWO having an electron beam positioned between a first plane and a second plane; each of the first and the second plane defining at least one of a focus electrode, a first anode, a second anode (or a slow-wave circuit) and one or more collector.

Another object of the disclosure is to provide an apparatus comprising an electron source directing an electron beam to a focus electrode, a first anode and a second anode, whereby the electrons are collected by one or more collectors.

Still another object is to disclose a method for fabricating a BWO having an interdigital circuit.

Still another object of the disclosures is to provide a BWO where the electron source and the interdigital circuit are fabricated of the same diamond.

In still another embodiment, the disclosure relates to an electron gun integrated with a slow-wave circuit.

A still further object of the disclosure is to provide a BWO requiring a substantially lower operation voltage as compared with the conventional BWO.

A further object of the disclosure is to provide a BWO having substantially higher interaction efficiency between the slow-wave guide and the electron beam.

These and other objects will be discussed in relation with the following drawings.

DETAILED DESCRIPTION OF THE DRAWINGS

FIGS. 1A–C are schematic representations of one embodiment of the disclosure;

FIGS. 2A–2B are schematic representations of the slow-wave guide circuit according to one embodiment of the disclosure;

FIGS. 3A–B are schematic representations of the backward wave oscillator according to the same embodiment of the disclosure;

Figure 6:
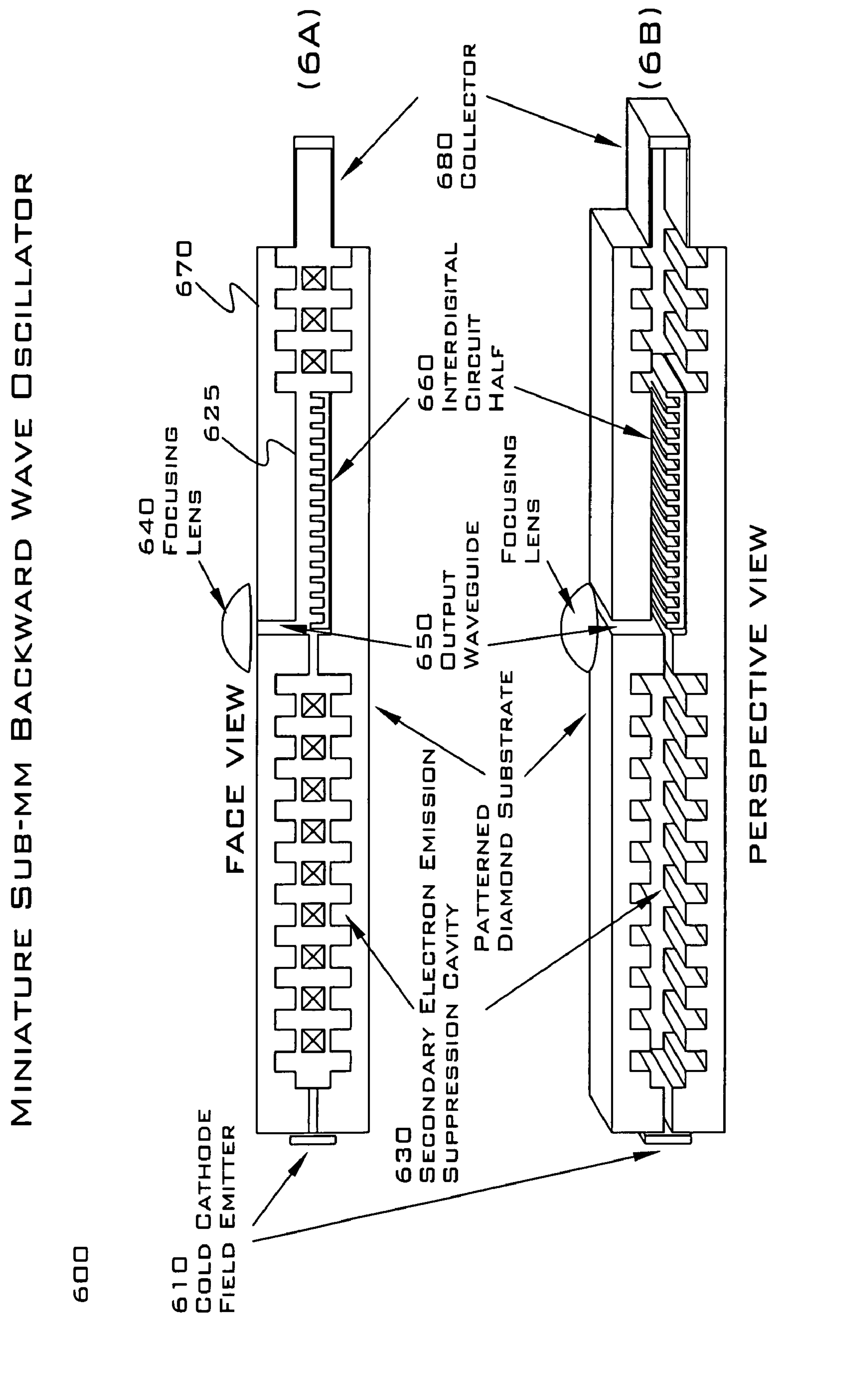
Figure 7:
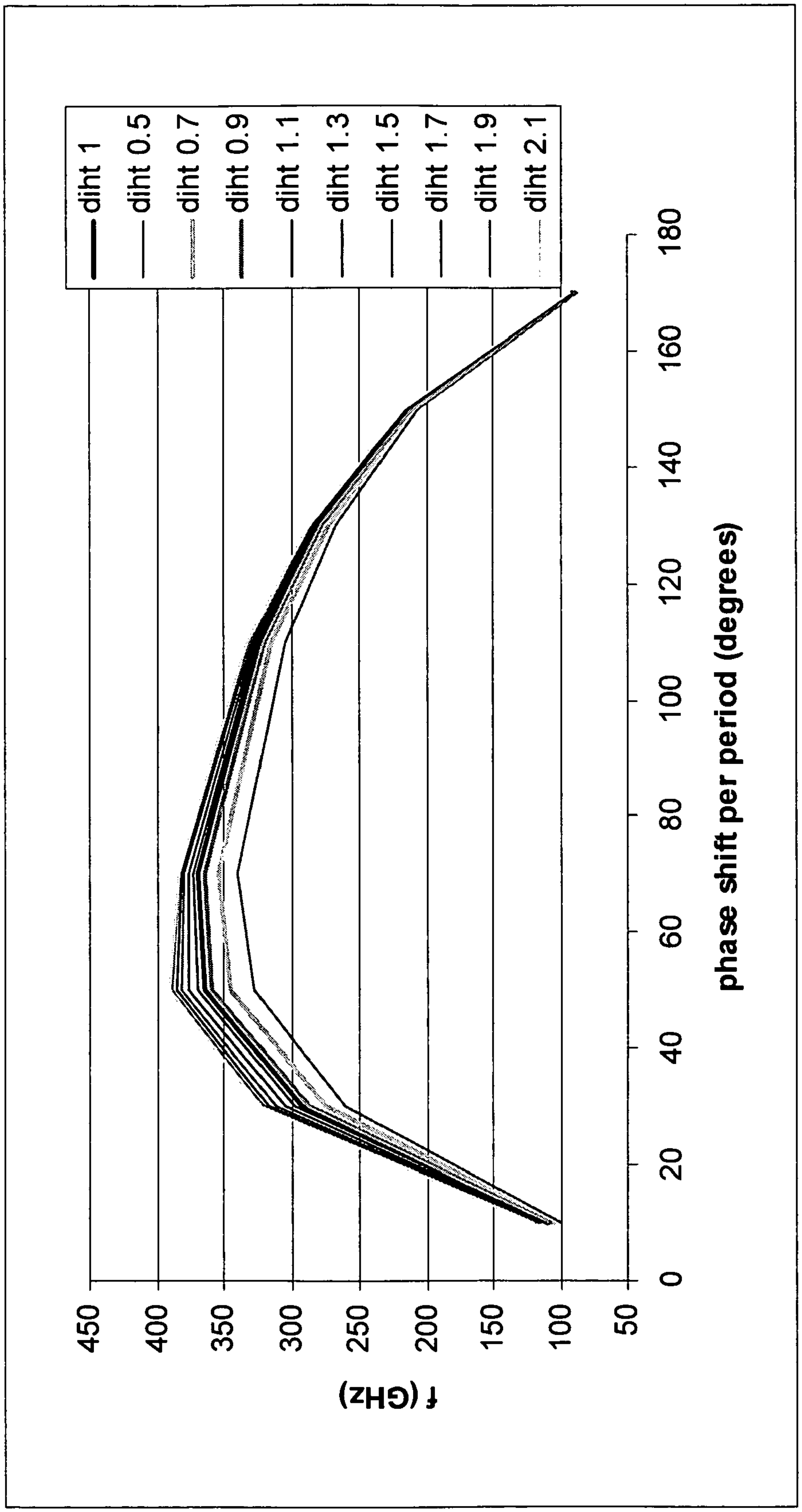
Figure 8:
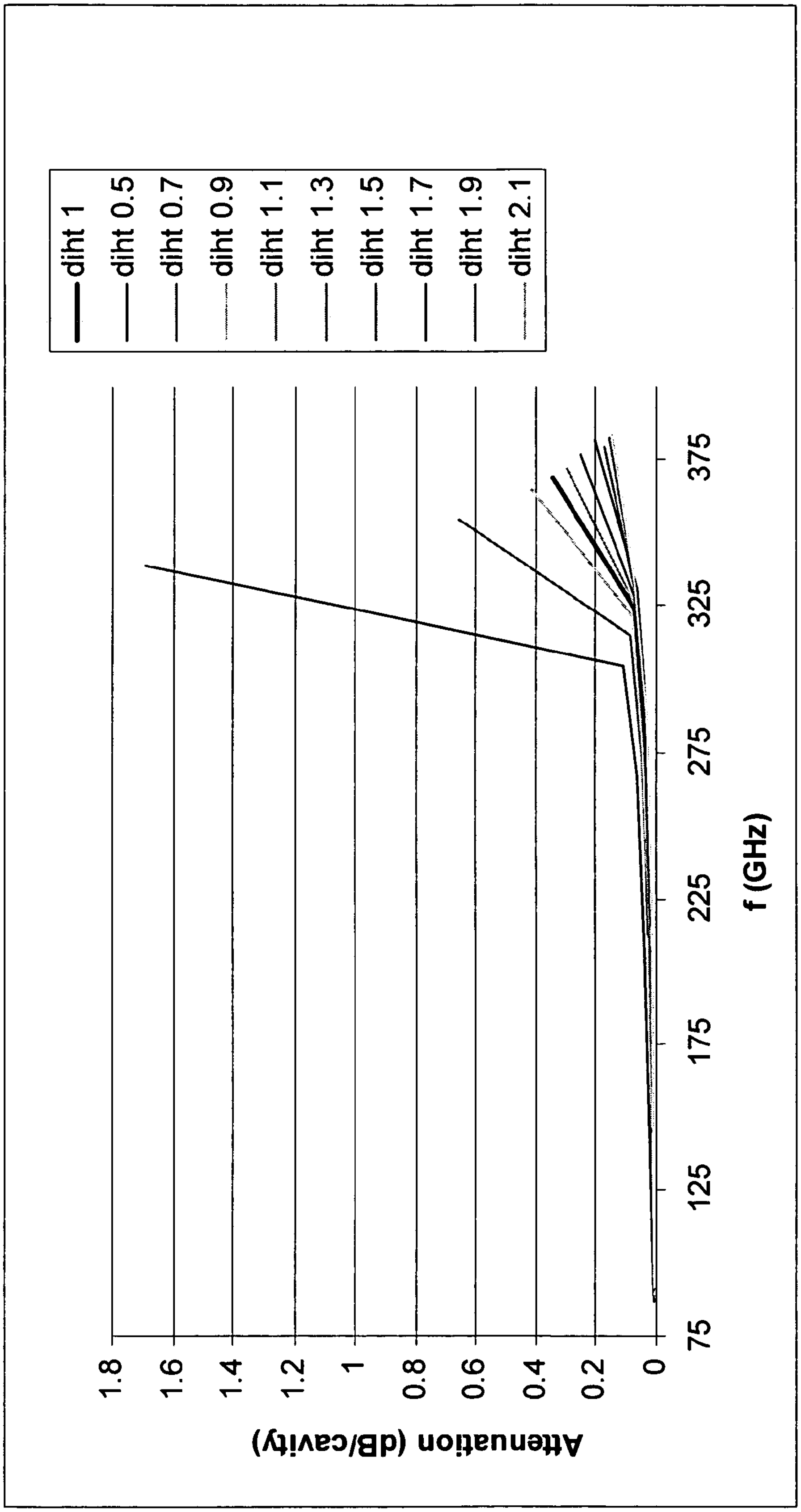
Figure 9:
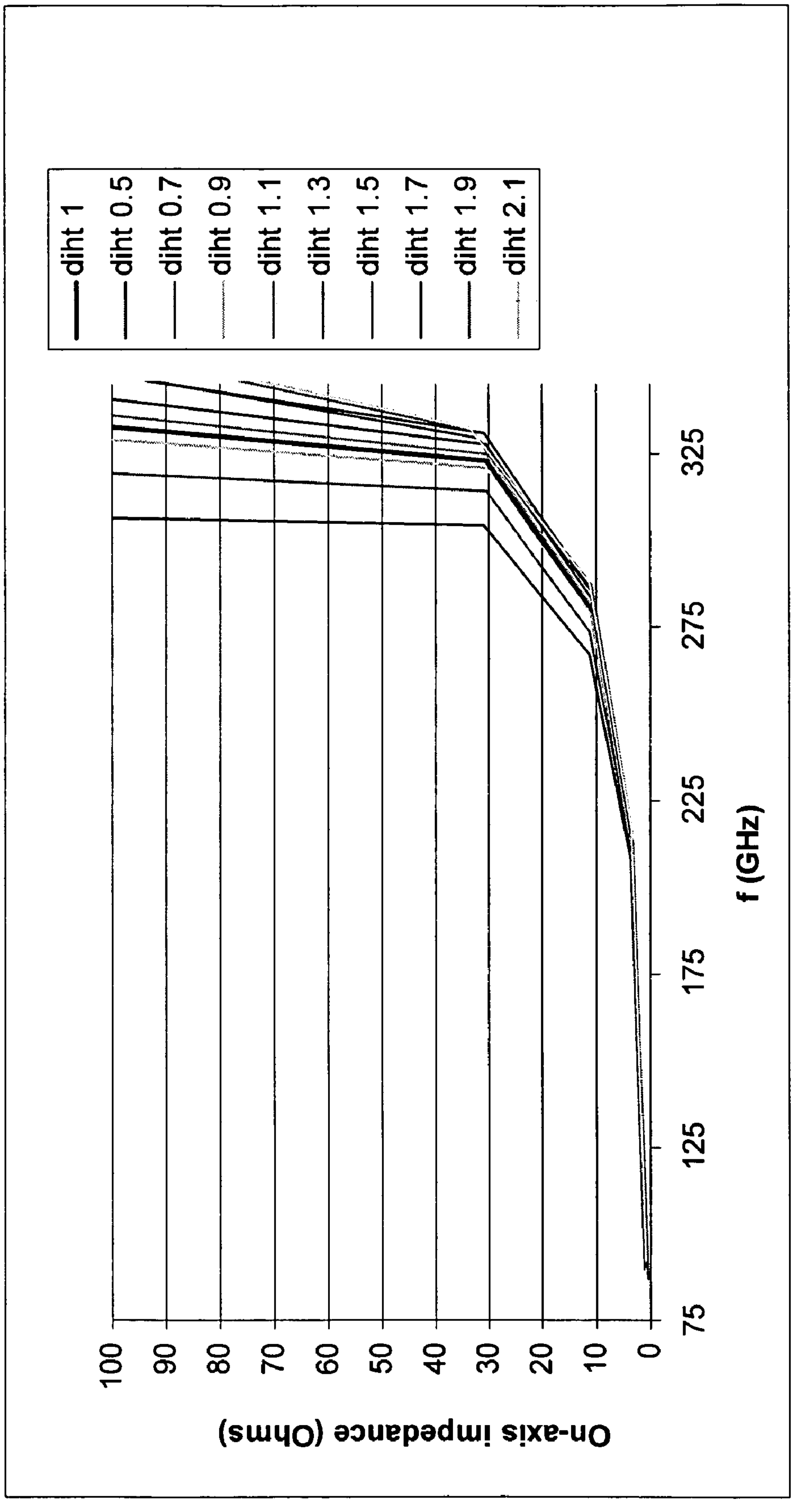
Figure 10:
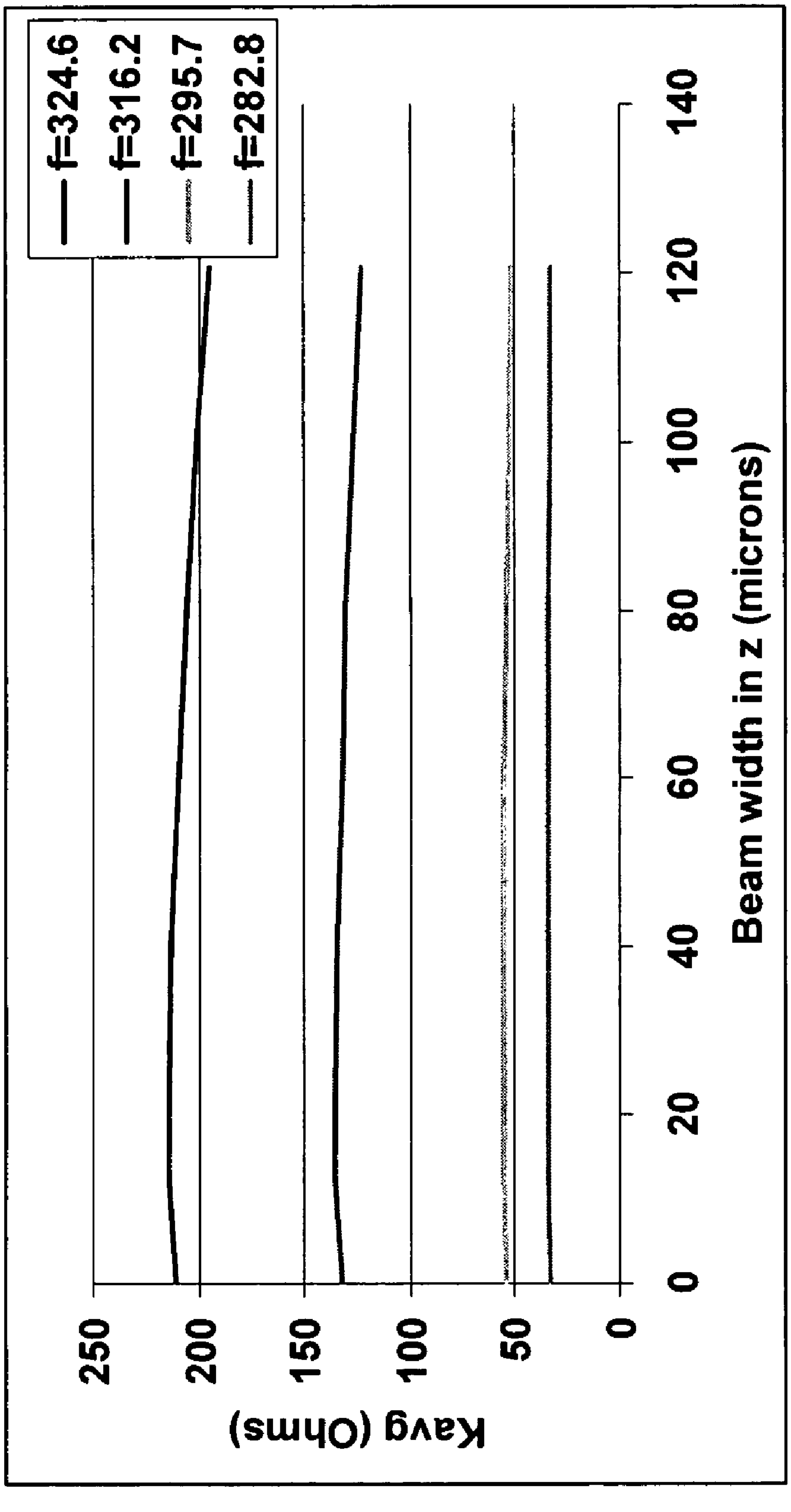
Figure 11:
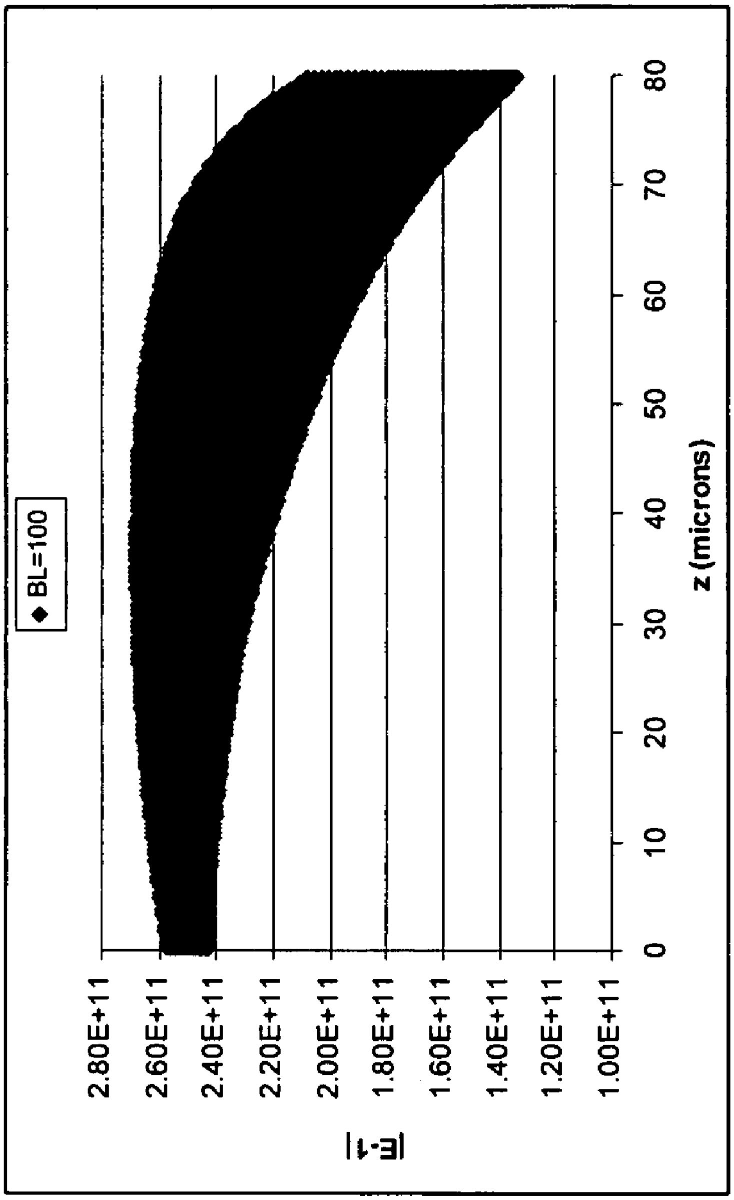
Figure 12:
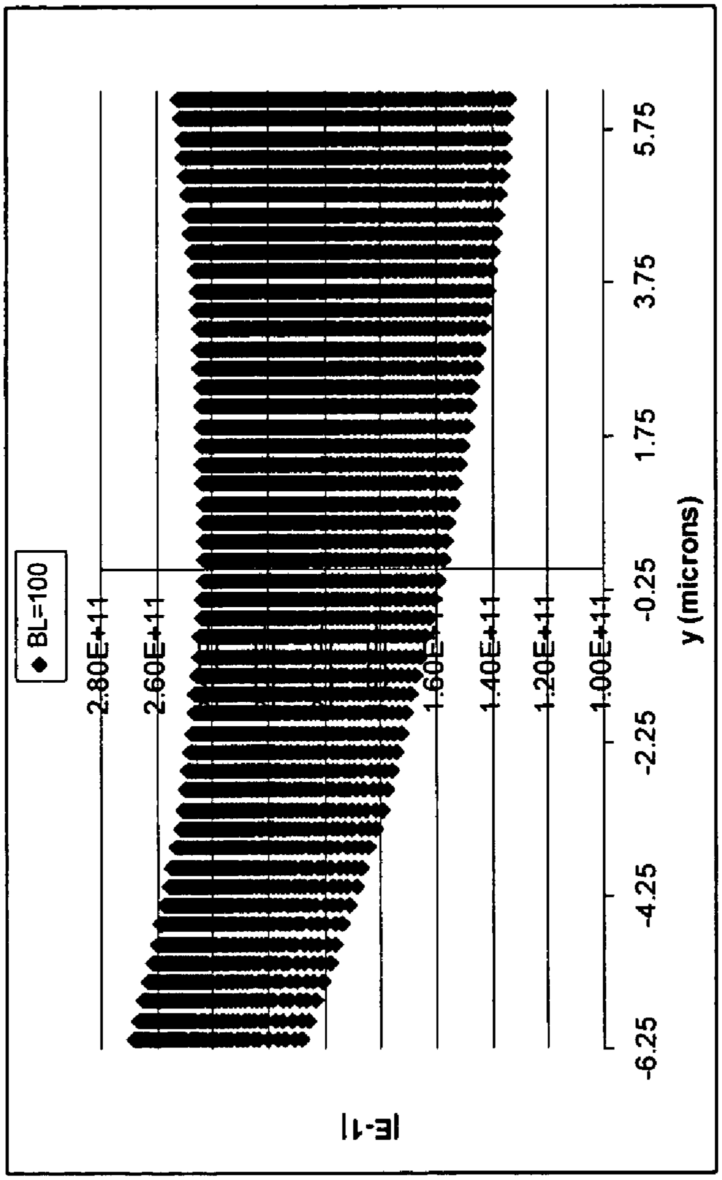
Figure 13:
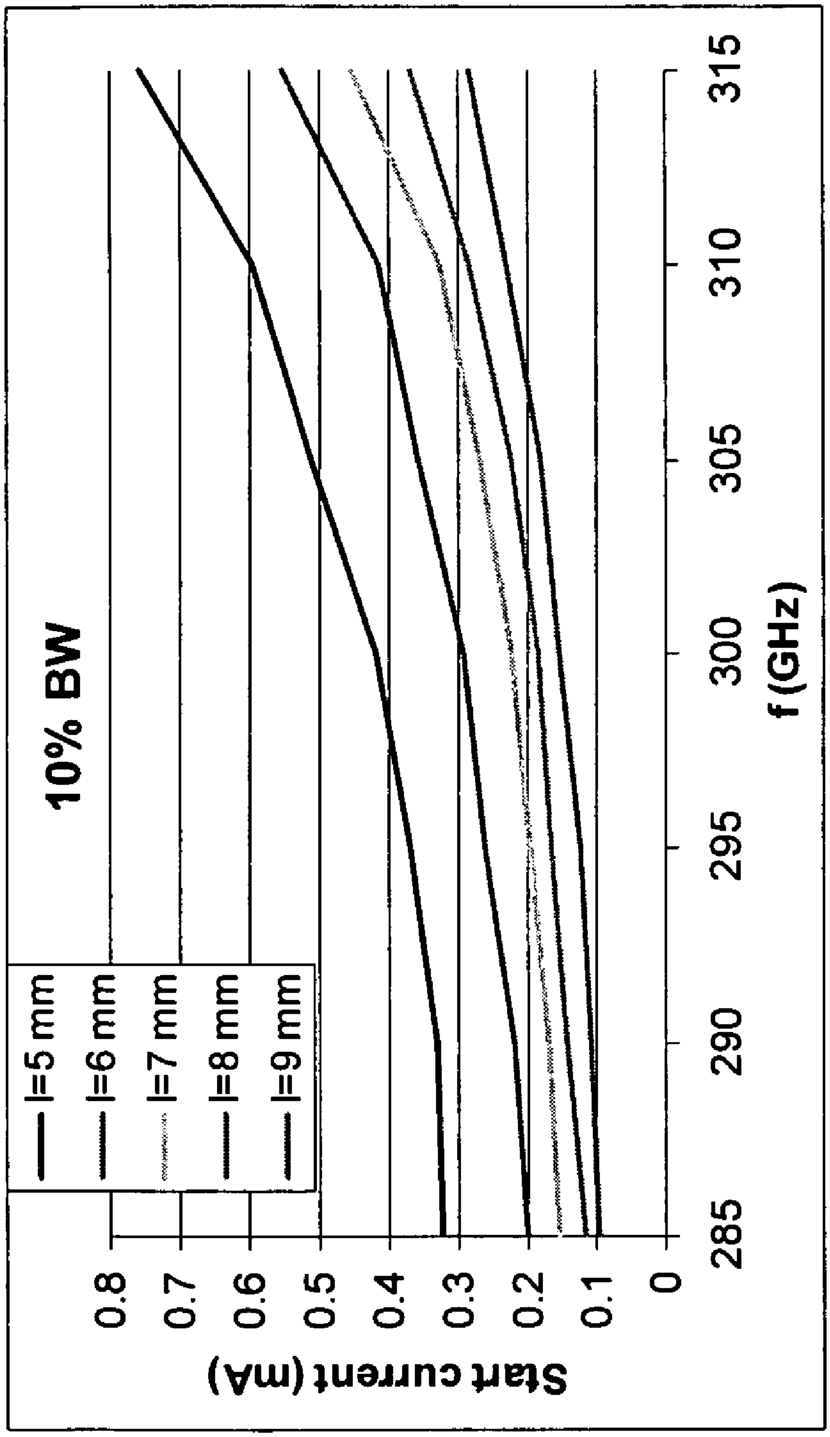
Figure 14:
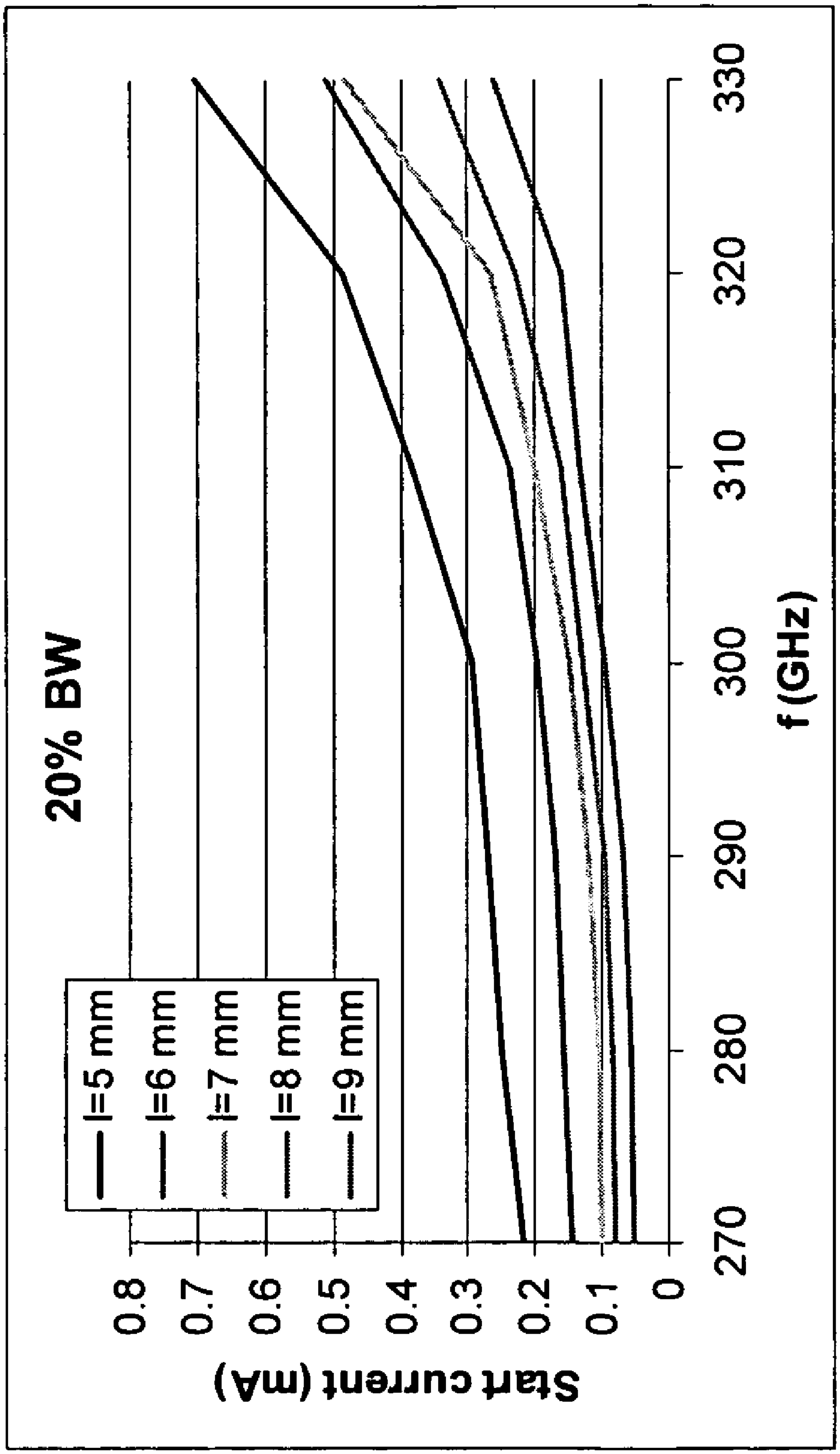
Figure 15:
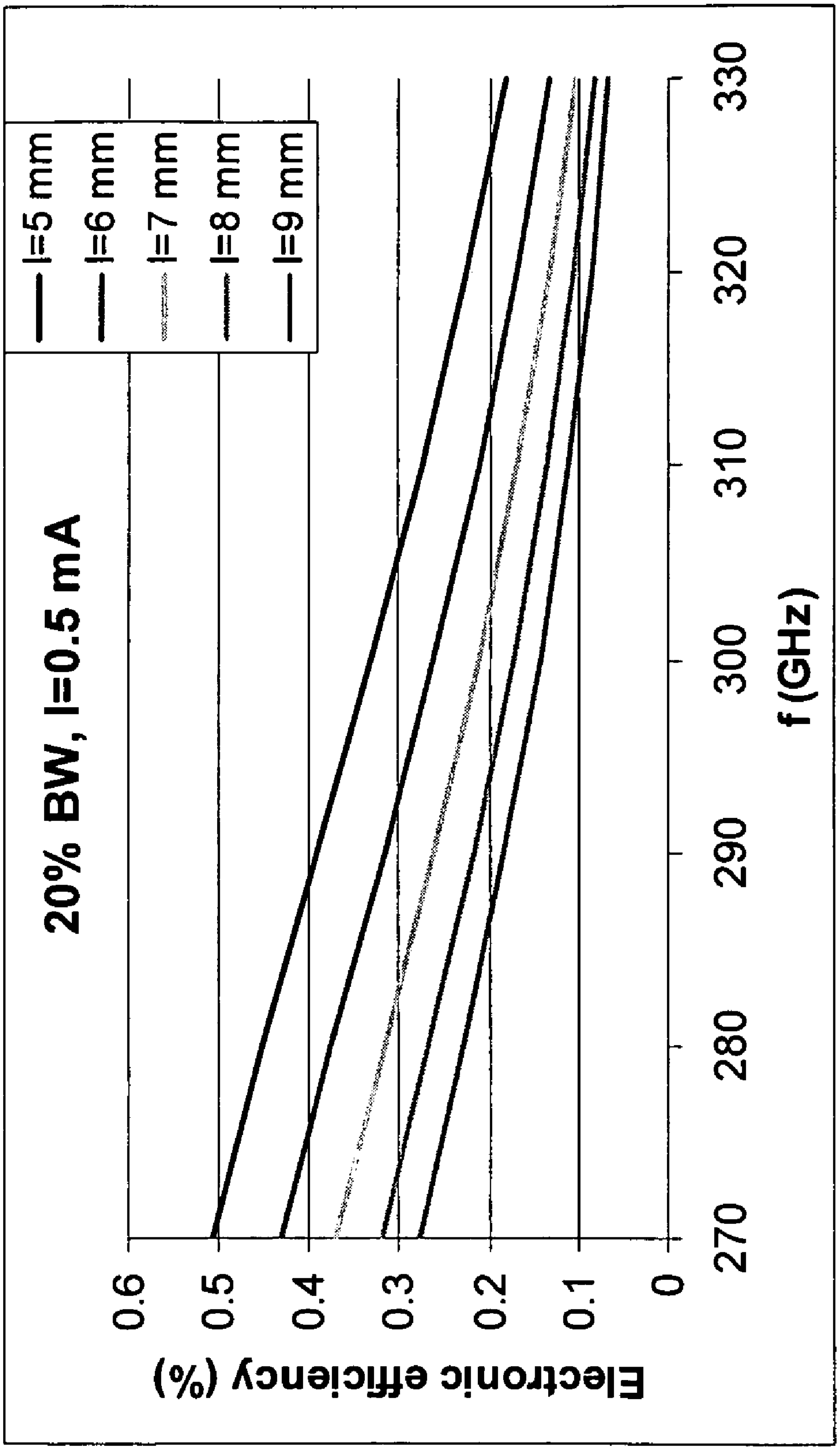
Figure 16:
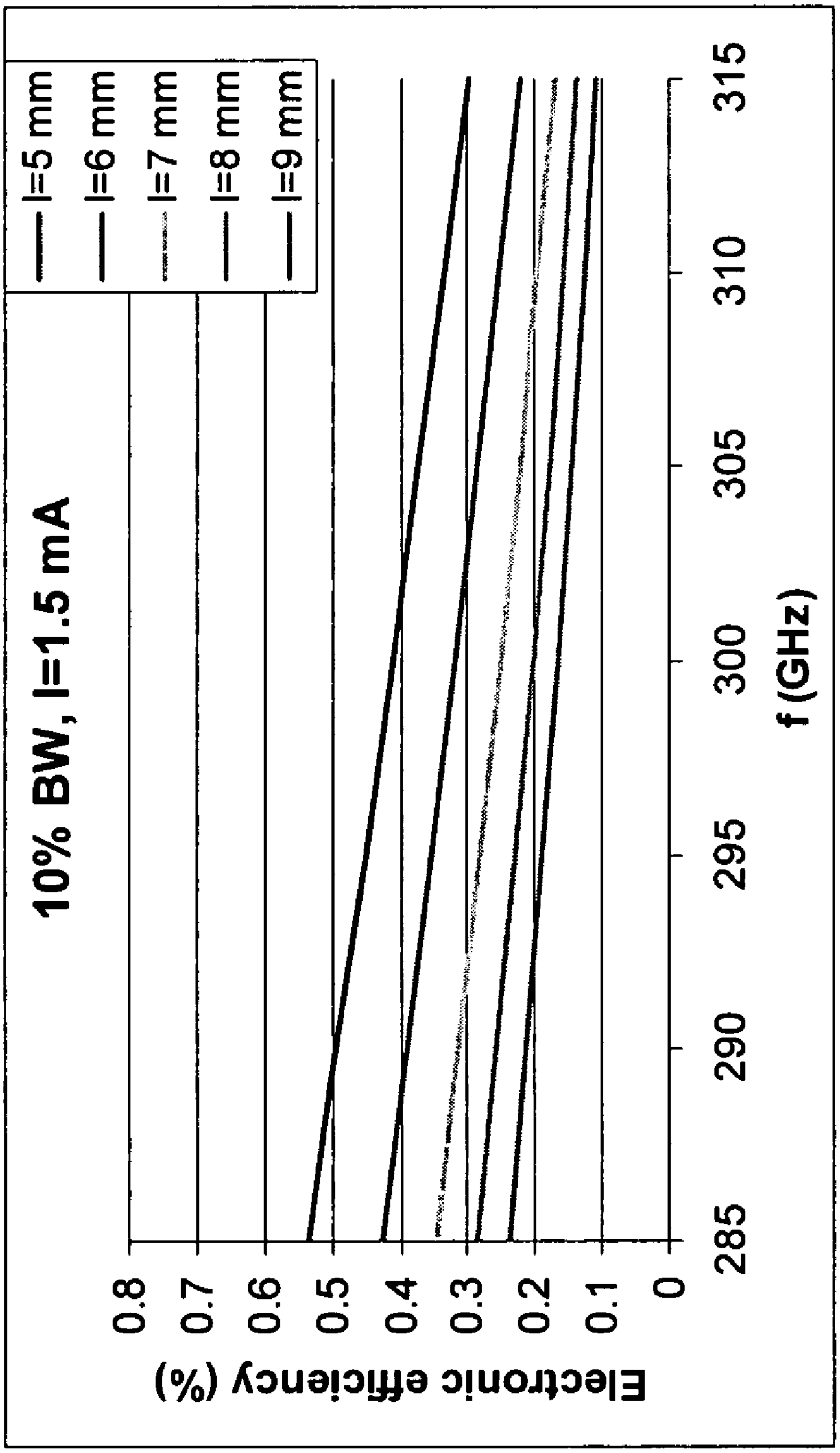
Figure 17:
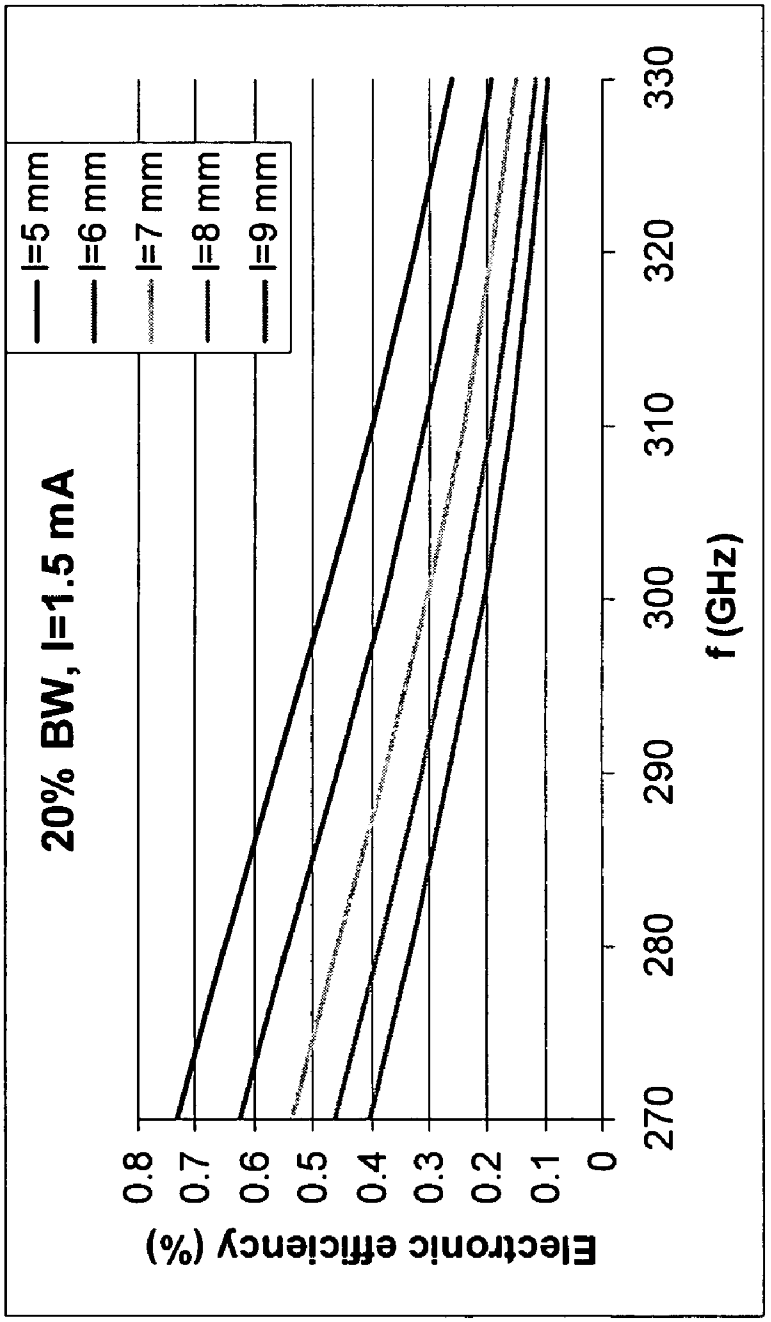
Figure 18:
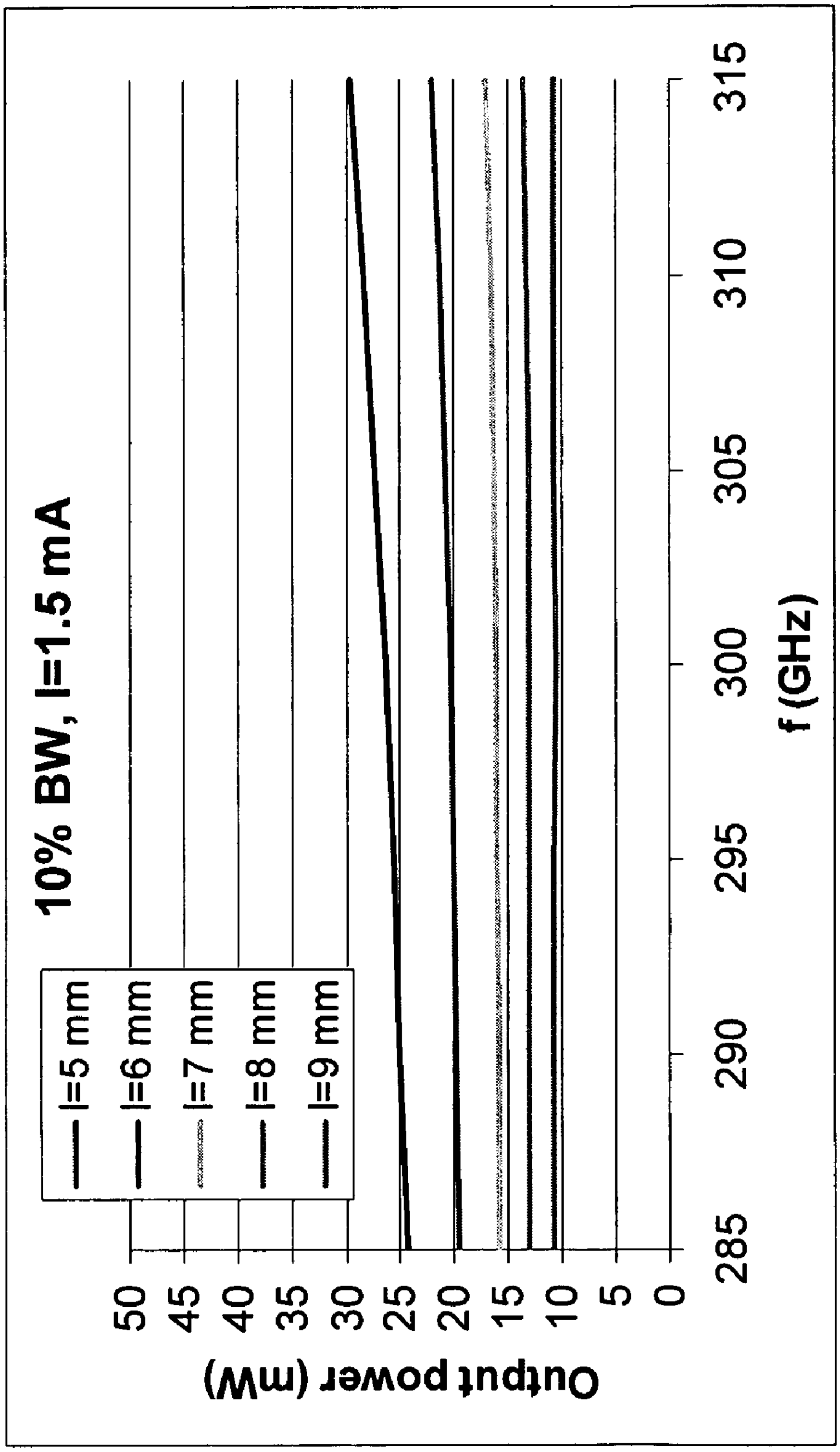
Figure 19:
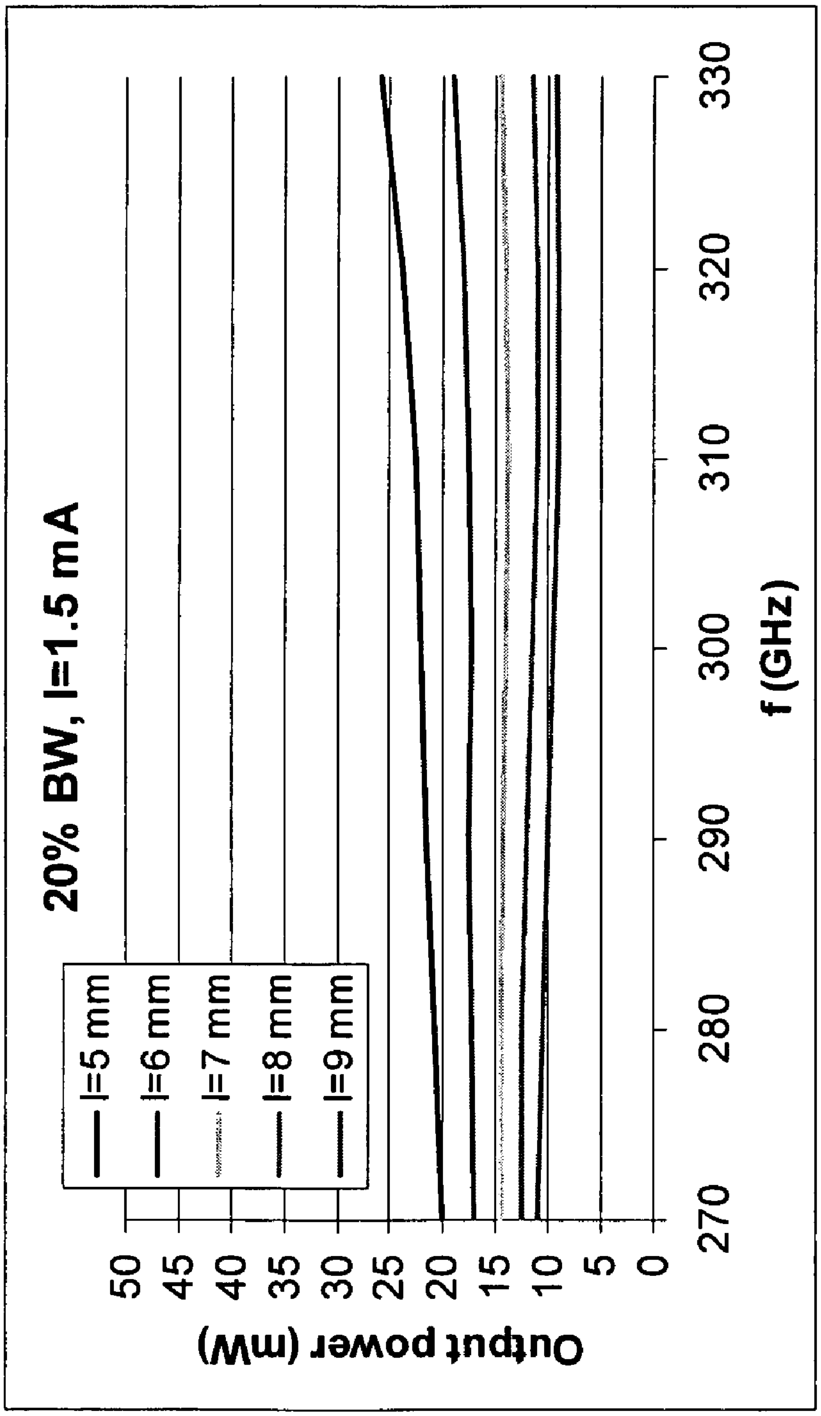
Figure 20:
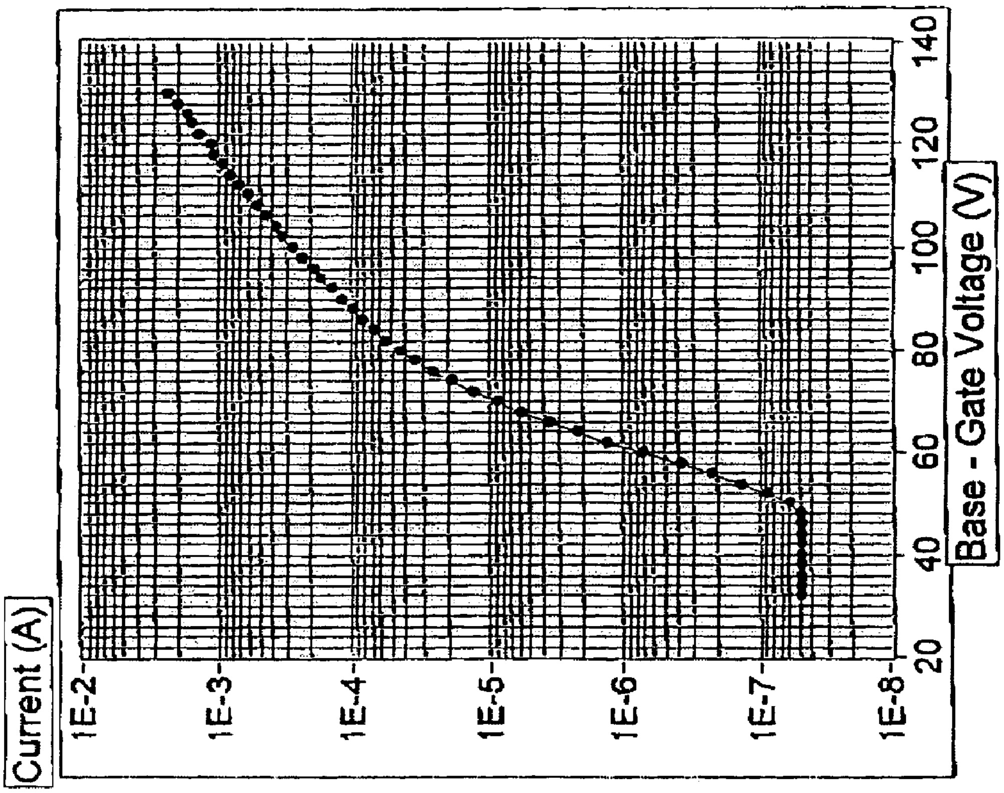
Figure 21:
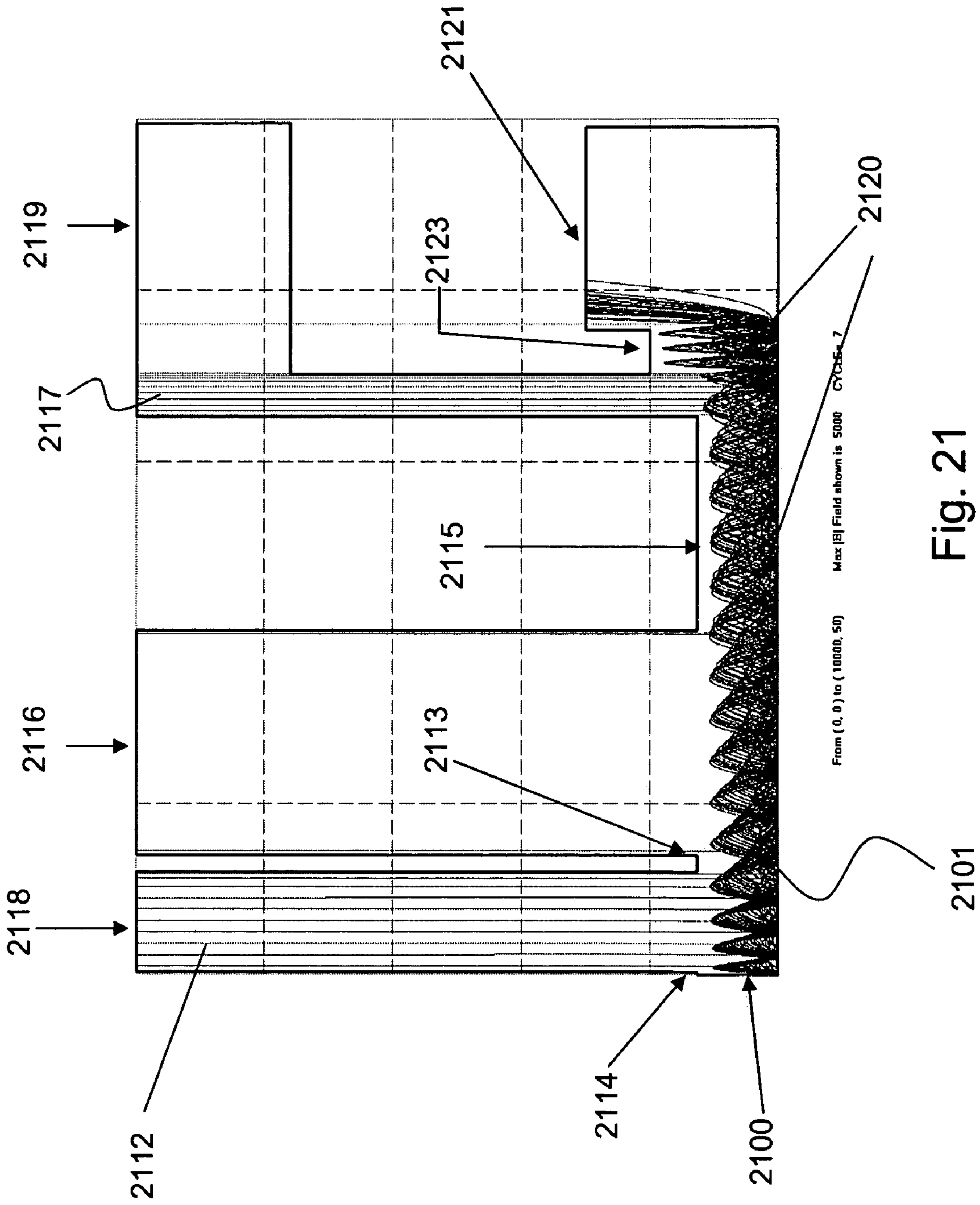
Figure 22:
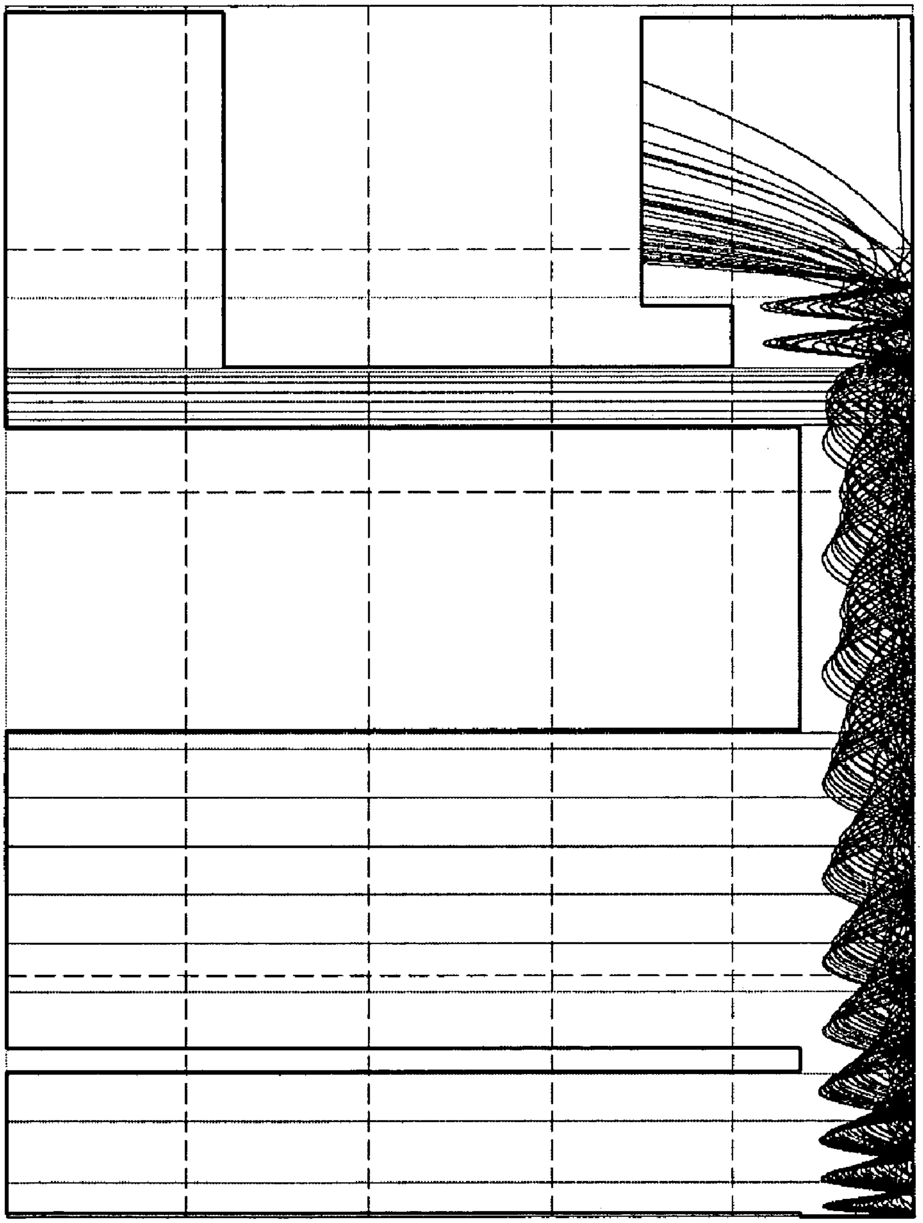
Figure 23:
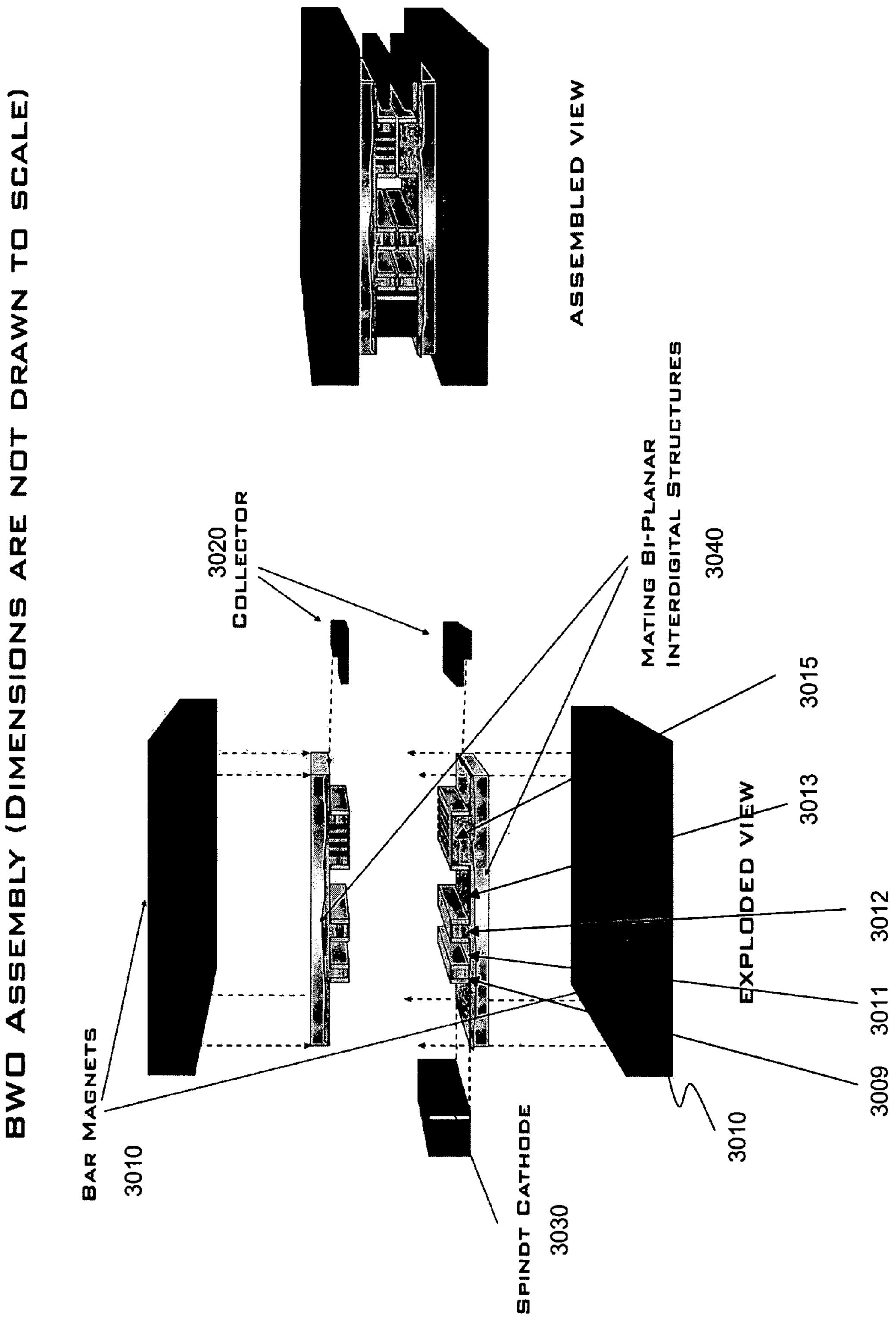
Figure 24B:
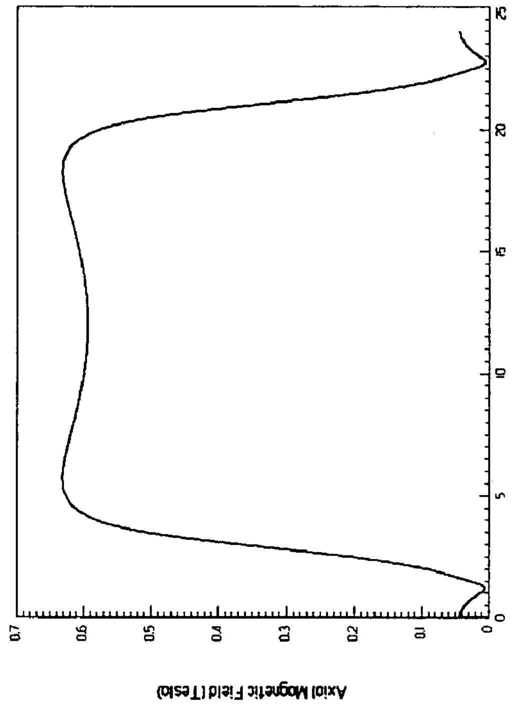
Figure 24A:
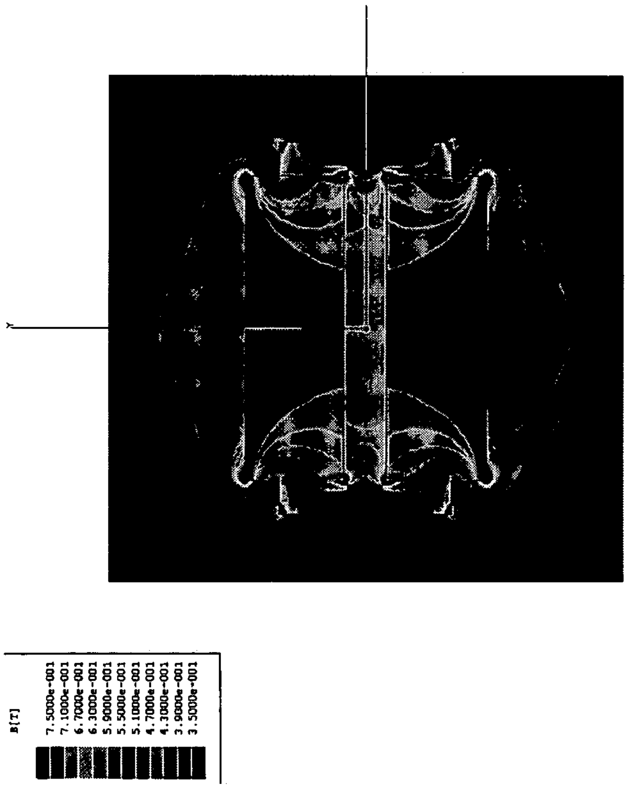
Figure 25:
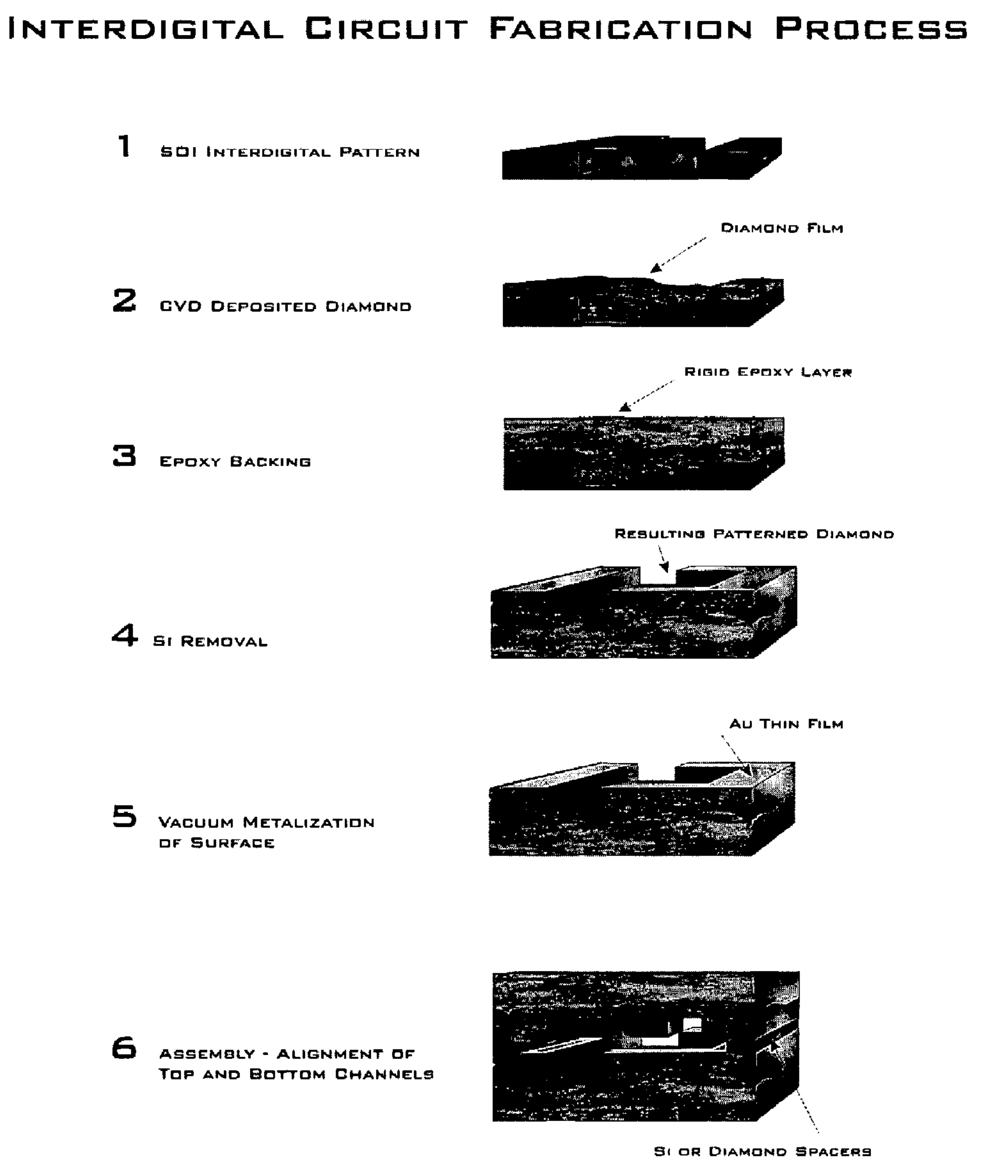
Figure 26:
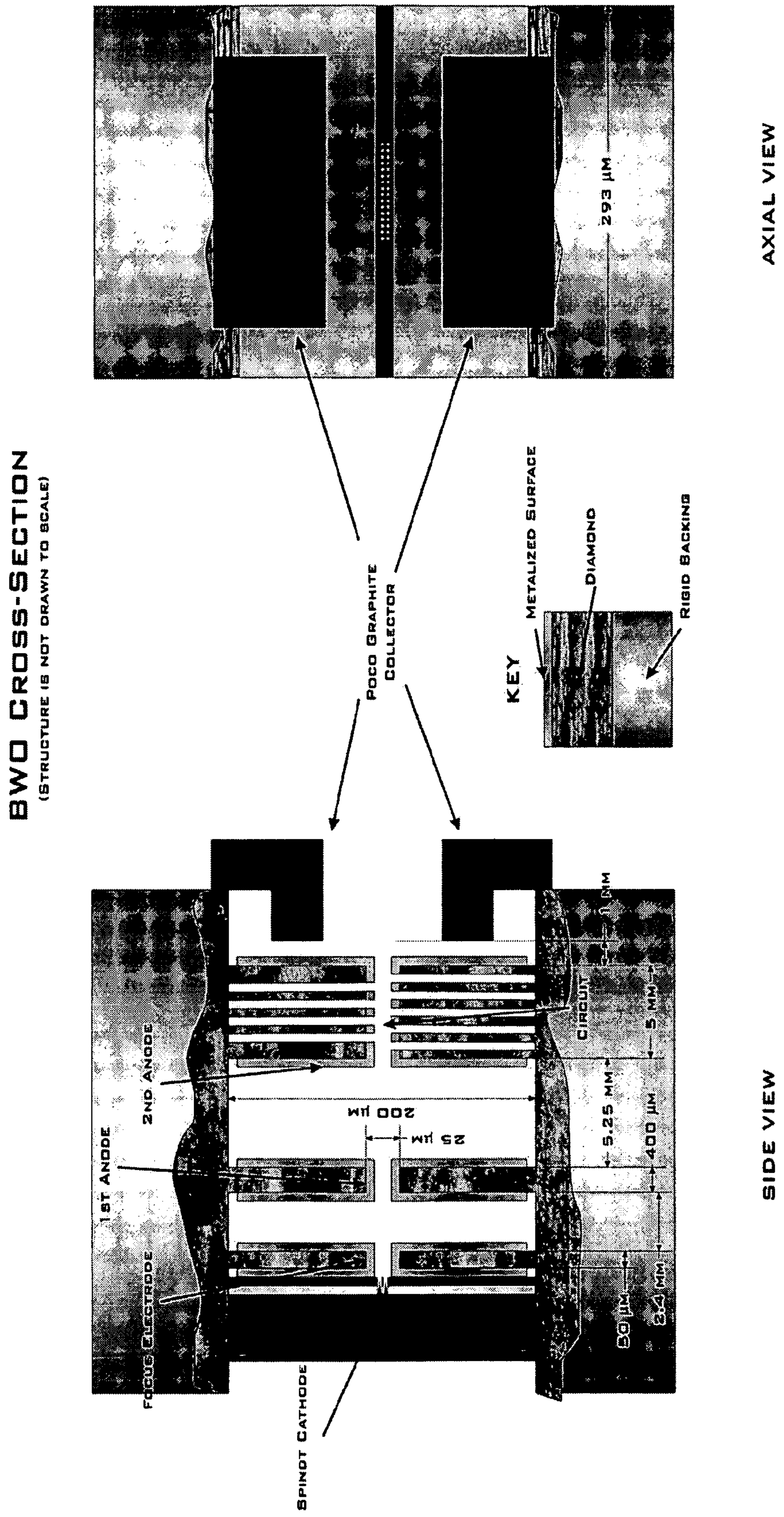
Figure 27:
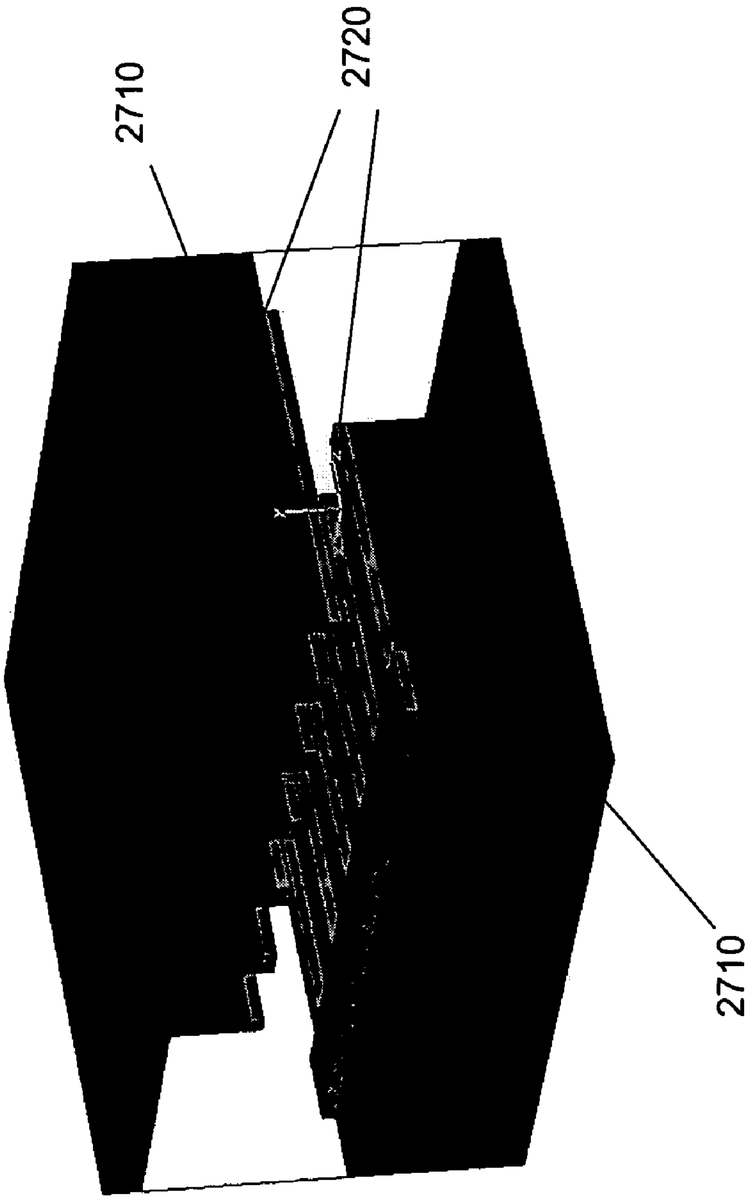
Figure 29:
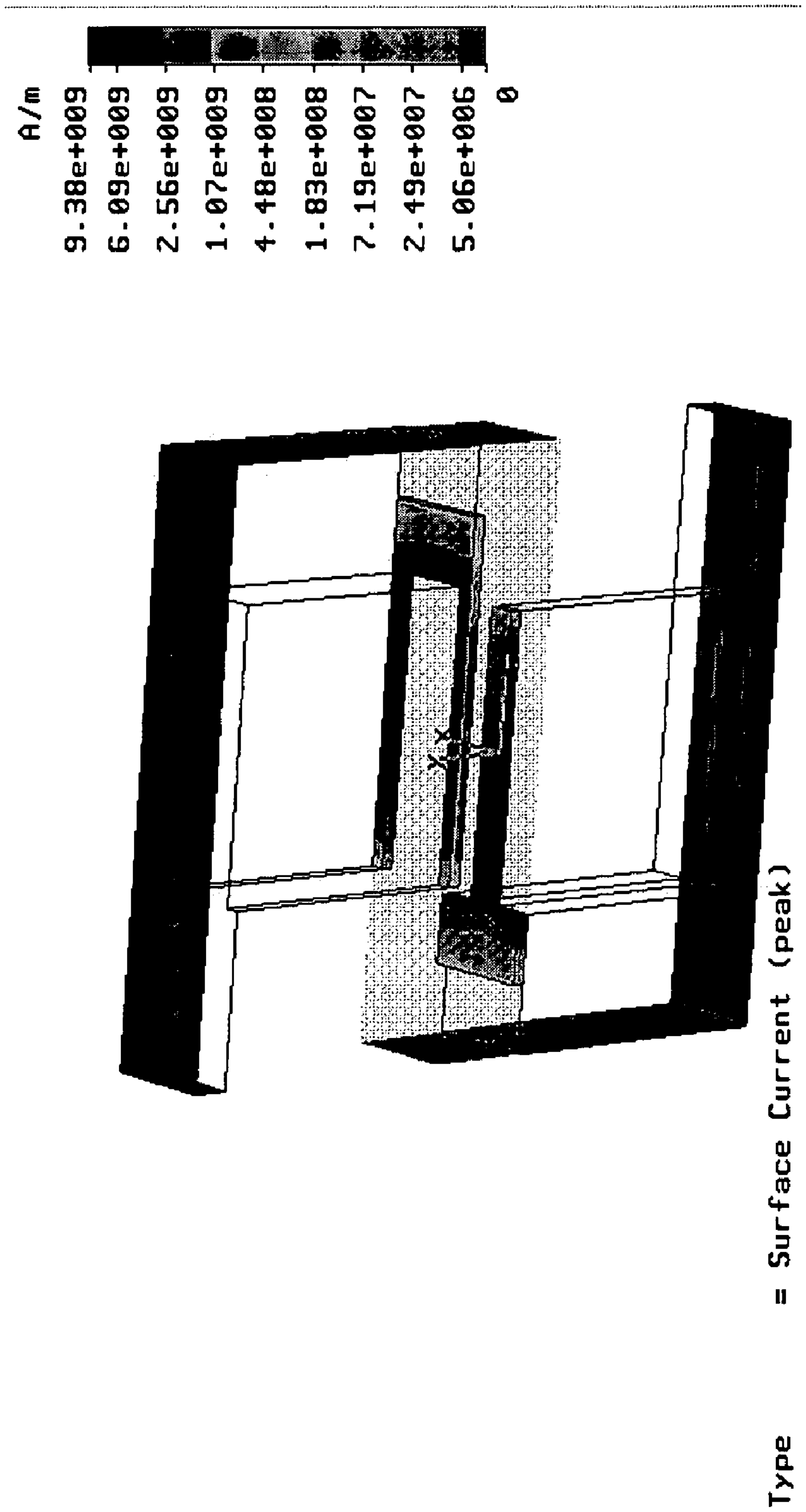
Figure 30:
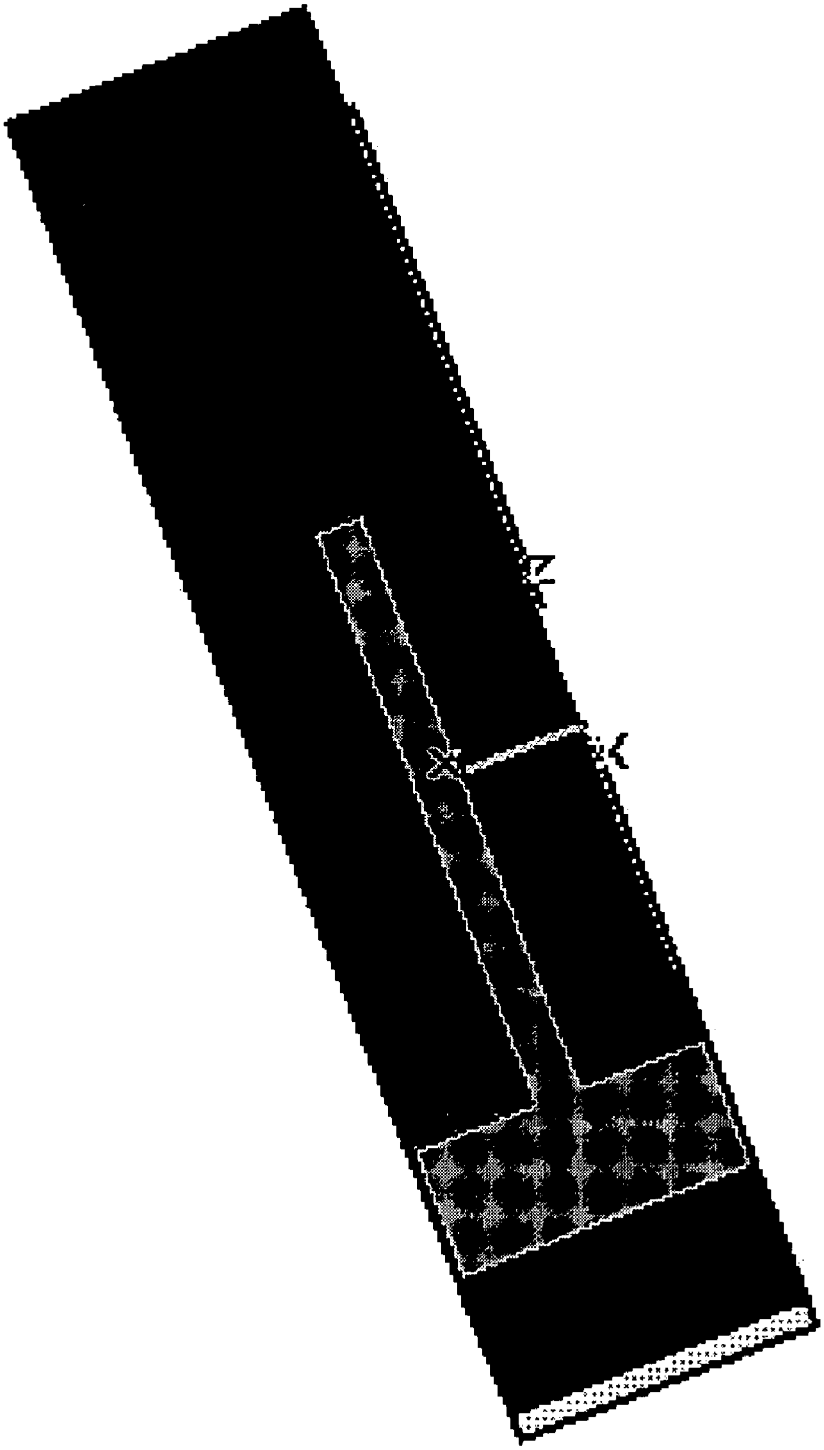

FIG. 6 schematically represents an exemplary configuration for a backward wave oscillator;

FIG. 7 shows the effect on the dispersion diagram resulting from the variation of the height of the dielectric fingers;

FIG. 8 shows the effect on attenuation due to the variation in finger height;

FIG. 9 shows the effect on impedance due to the variation in finger height;

FIG. 10 shows the impedance for an electron beam of about 12.5 microns averaged over the beam width for an exemplary embodiment having the 10% bandwidth design;

FIG. 11 shows the field intensity as a function of transverse position (z) at center operating frequency for βL=100 degrees;

FIG. 12 shows the field intensity as a function of y at βL of 100 degrees;

FIG. 13 shows the start oscillation current as a function of circuit length for an embodiment of the disclosure having the 10% bandwidth design;

FIG. 14 shows the start oscillation current as a function of circuit length for an embodiment of the disclosure having the 20% bandwidth design;

FIG. 15 shows the impact of circuit length on efficiency with constant current of 0.5 mA for the 20% bandwidth design;

FIG. 16 shows the electronic efficiency for an embodiment of the disclosure having 10% bandwidth design and using a 1.5 mA electron beam;

FIG. 17 shows electronic efficiency for an exemplary embodiment using 20% bandwidth design with 1.5 mA beam;

FIG. 18 shows output power for an exemplary embodiment using a 10% bandwidth design with 1.5 mA beam;

FIG. 19 shows output power for an exemplary embodiment using a 20% bandwidth design with 1.5 mA;

FIG. 20 shows typical emission characteristics for a Spindt-type field emitter;

FIG. 21 shows the electron gun circuit and collector for the 1.8 kV (low frequency) embodiment;

FIG. 22 shows the electron gun circuit and collector for the 6.6 kV (high frequency) case;

FIG. 23 shows the assembly of a backward wave oscillator according to one embodiment of the disclosure;

FIGS. 24A–B show the magnetic fields generated by a pair of NdFeB 50 bar magnets;

FIG. 25 shows an exemplary circuit fabrication process according to one embodiment of the disclosure;

FIG. 26 illustrates a cross-sectional area showing metalization pattern according to one embodiment of the disclosure;

FIG. 27 schematically illustrates a 3-D view of biplanar interdigital circuit with metal undercut according to one embodiment of the disclosure;

FIGS. 28A–E show field plots of the interdigital circuit shown in FIG. 27;

FIG. 29 is a field plot of a single period of the interdigital circuit according to another embodiment of the disclosure; and FIG. 30 shows a top view of the circuit with an exemplary undercut.

DETAILED DESCRIPTION

Figure 1A:
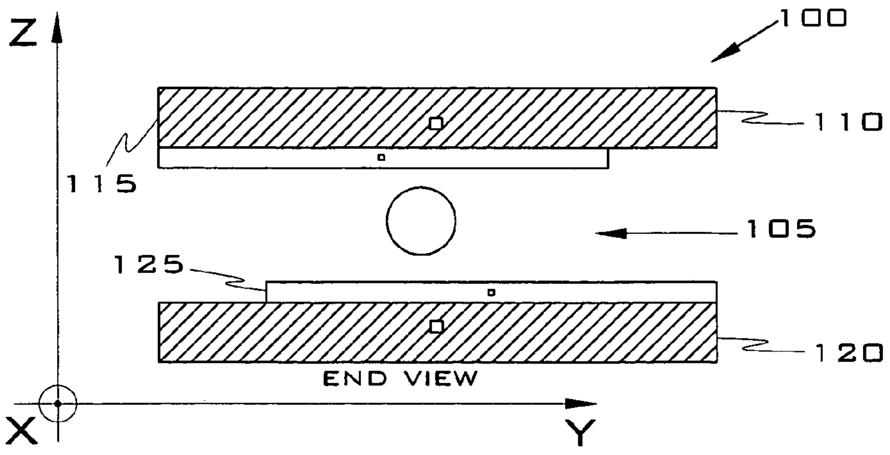
Figure 1B:
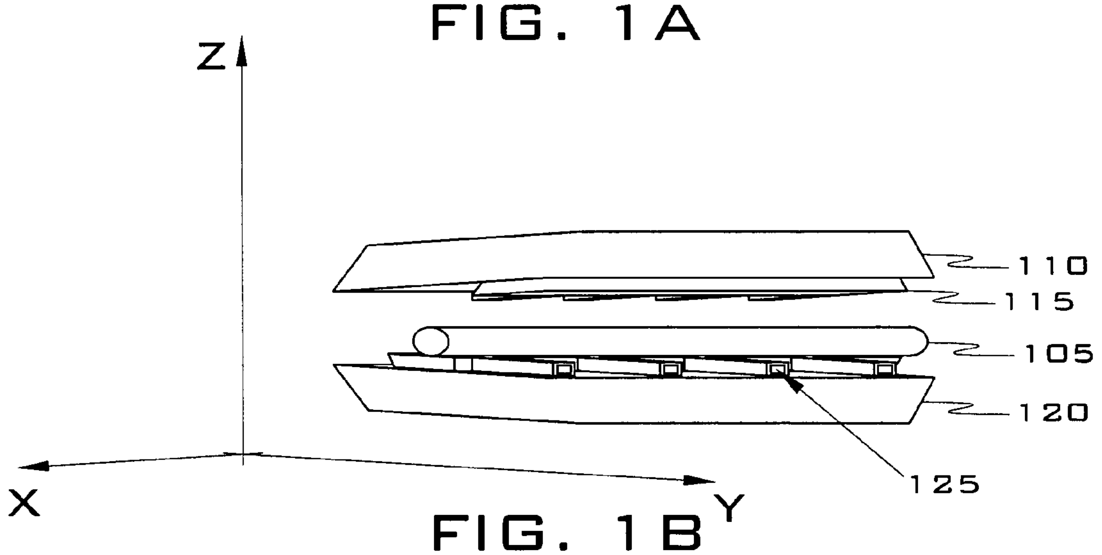
Figure 1C:
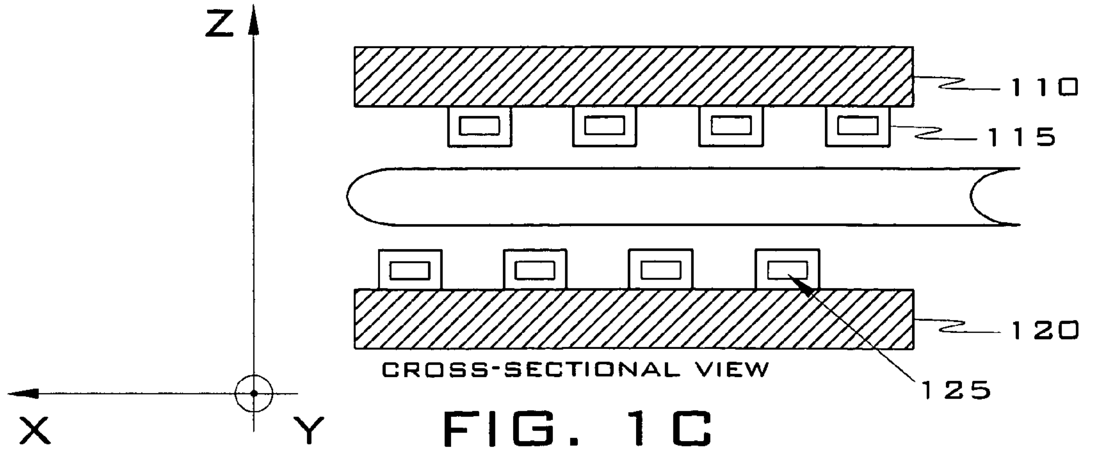

FIGS. 1A–1C are schematic representations of one embodiment of the disclosure. More specifically, FIGS. 1A–1C show a biplanar interdigital backward wave oscillator circuit where the interdigital circuit is separated into two pieces that are positioned on closely-spaced parallel planes. The space between the two planes defines a path for the electron beam that passes through the propagation path of the electromagnetic wave. This is a completely novel approach and in contrast to the conventional system where the electron beam propagated through an evanescent wave that resides above the planar circuit.

Referring to FIG. 1A, electron beam 105 is shown interposed between plates 110 and 120 of the biplanar interdigital slow-wave circuit. Each of plates 110 and 120 defines circuit 115 and 125 respectively. The electron path 105 is shown as a round electron beam. The circuits 115 and 125 are shown more prominently in FIG. 1B. With reference to FIG. 1B, it should be noted that the top and bottom plates (respectively, 110 and 120) are parallel. The apparent angle is added to show perspective. FIG. 1C is a schematic illustration of the cross-sectional view of the backward wave oscillator 100. The slow-wave circuits 115 and 125 appear as overlapping digits in FIG. 1C. As will be discussed in greater detail, in one embodiment, the body of device 100 can be constructed from diamond.

In one embodiment, the biplanar digital circuit can be designed to operate at about 300 GHz. In designing the apparatus 100, the first step is to define the dimensions of the circuit for optimal performance.

Figures 2A, 2B:
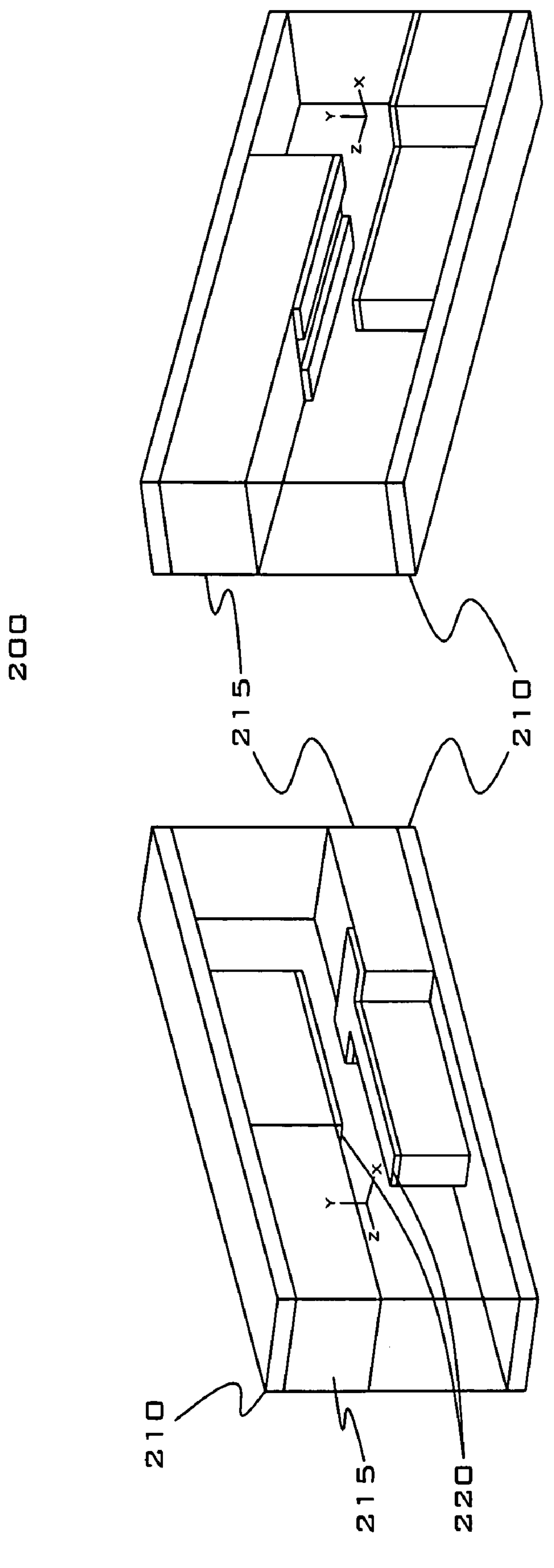

FIGS. 2A and 2B represent a computer generated model of the circuit according to one embodiment of the disclosure. As shown in FIG. 2, the backward wave oscillator 200 is enveloped by the conducting walls 210 and the circuit is infinitely periodic in the beam propagation direction (the x-direction). The conducting walls 210 can be made of diamond with relative permittivity of 5.5. The interdigital "fingers" 215 can also be made of diamond. A thin layer of metal 220 can be deposited on the diamond circuit 215. In one embodiment, the structure can be surrounded by diamond. However, the use of conducting layer boundaries greatly facilitates computations of the sensitivity of various parameters and has been demonstrated to have negligible influence on the frequency of operation.

Figure 3B:
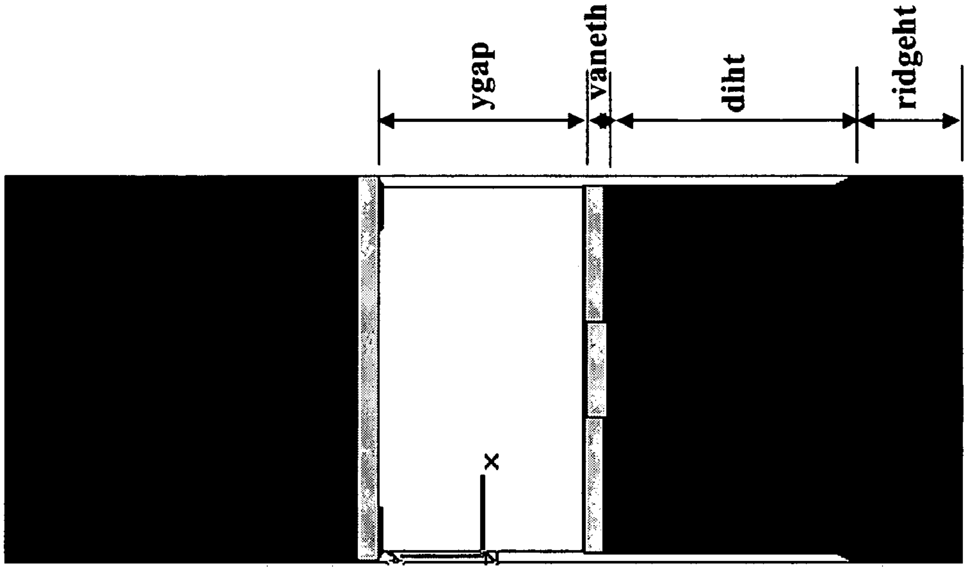
Figure 3A:
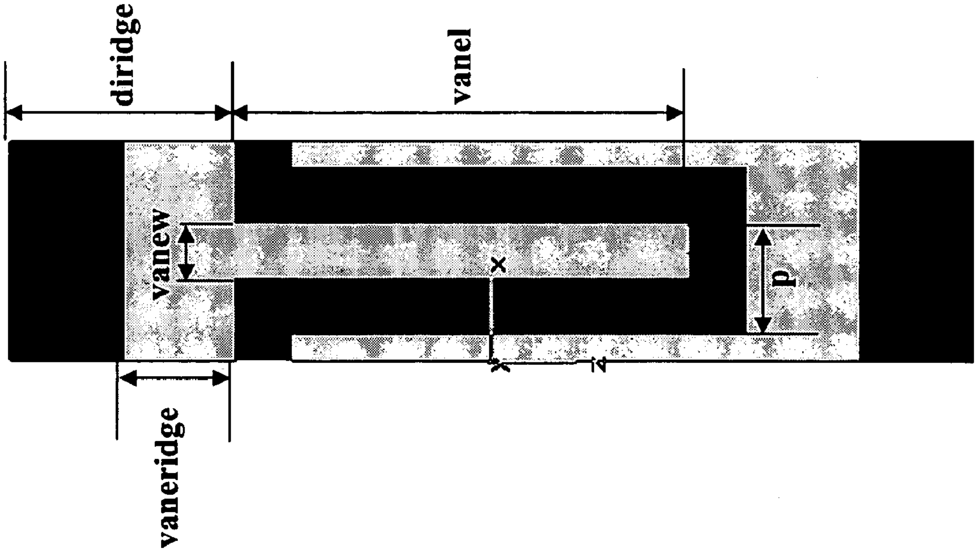

FIGS. 3A and 3B are schematic representations of the backward wave oscillator according to another embodiment of the disclosure. The schematic of the circuit that defines the device dimensions is shown in FIGS. 3A and 3B, and a set of preliminary dimensions utilized during the so-called parameter study are listed in Table 1. These dimensional parameters can be adjusted to arrive at different designs as described herein.

TABLE 1

Preliminary 300 GHz biplanar interdigital circuit dimensions (See FIG. 3)

| Dimensions | (microns) |
|---|---|
| vaneridge | 37.75 |
| vanew | 18.4 |
| vanel | 151 |
| vaneth | 4 |
| diridge | 75.5 |
| p | 36.8 |
| xS | 18.4 |
| zS | 18.4 |
| diht | 46 |
| ridgeht | 20 |
| ygap | 25 |

To perform the parameter study, each dimensional parameter was varied by multiplying it by a factor from 0.5 to 1.5 or in some cases 2.1. For example, the plots showing the variations to diht are labeled diht=1, 0.5, 0.6, etc. This implies that the standard value of diht (46 microns) was multiplied by 1, 0.5, 0.6, etc. The dispersion, on axis interaction impedance and attenuation were computed for each of the parameters through this range of variations with the other parameters held at their nominal values. The results of the preliminary study show that diamond height (Diht) is compatible with transverse dimension of electron gun, thereby eliminating the need for additional masking and etching steps.

Figure 4:
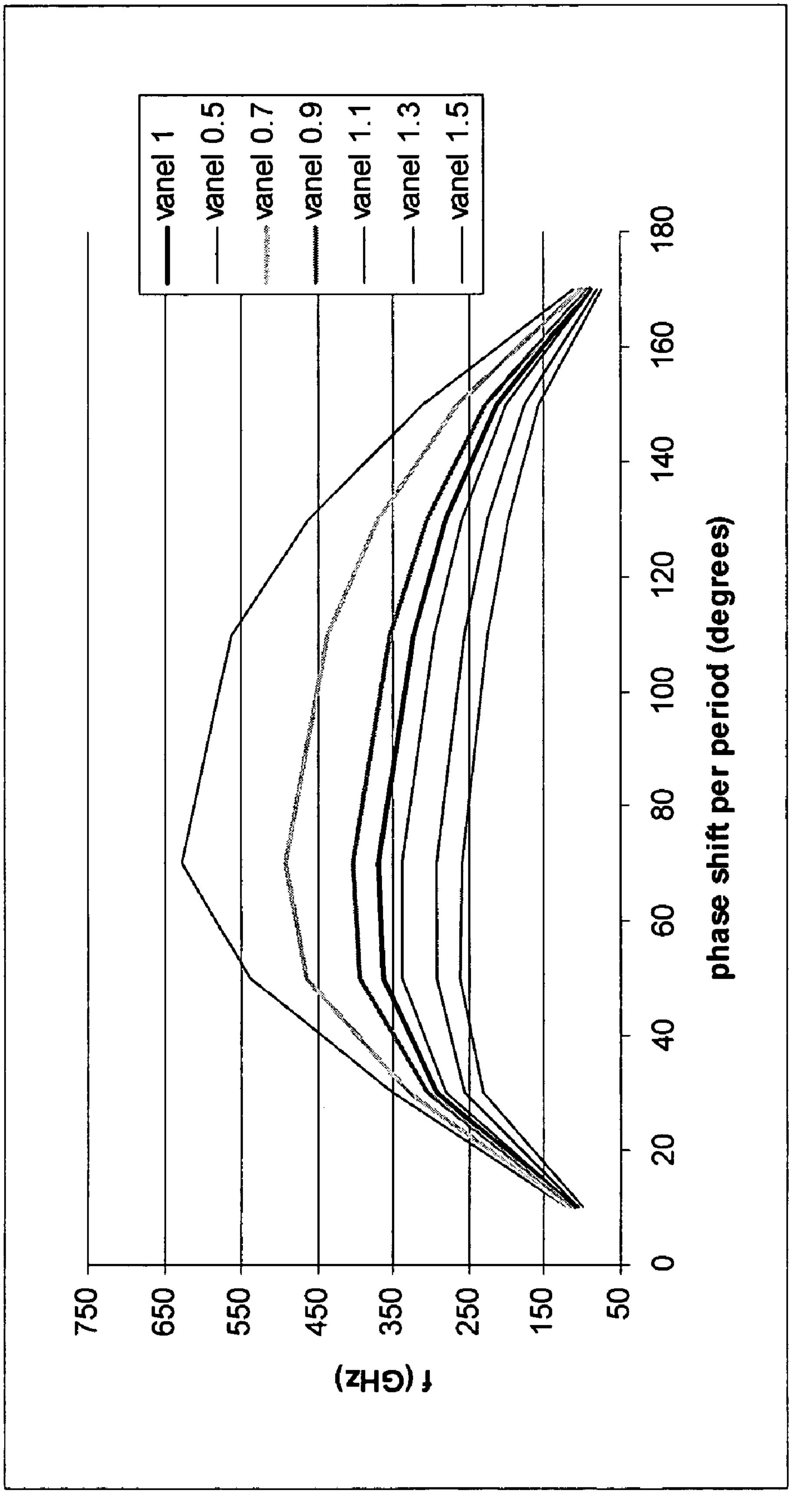
FIG. 4 shows the dispersion relation (ω-β diagram) for the biplanar interdigital circuit.

One of the more significant parameters for frequency control: is "vanel." (See FIG. 3A.) The plot of frequency as a function of phase shift (the ω-β diagram) for variations of vanel is shown in FIG. 4. For the range of parameters provided, variations of this configuration are shown to be operable to as high as 600 GHz.

A critical aspect for determining the strength of the coupling between the electron beam and the slow wave circuit is interaction impedance. The impedance can be expressed as:

$$K_0 = \frac{\int |E_0|^2 dS}{2\beta^2 PS} \tag{1}$$

Where $|E_0|$ is the magnitude of the fundamental n=0 harmonic, P is the total power, and S is the cross sectional area of the beam. For this circuit, $|E_0|$ was calculated by performing a spatial Fourier analysis along x (the direction of beam propagation) at discrete locations for z and y over the beam cross-sectional area. The average of these values over the beam cross section must be taken for the impedance.

The average involves a discrete spatial summation over z and y, or:

$$\frac{\int |E_0|^2 dS}{S} = \frac{\sum_z \sum_y |E_z|^2 \Delta z \Delta y}{S} \tag{2}$$

where Δz and Δy are the width of the discrete coordinate locations. At the time of the parameter variations, the cross section of the beam was not known. Thus, the on-axis interaction impedance was calculated for all variations.

Figure 5:
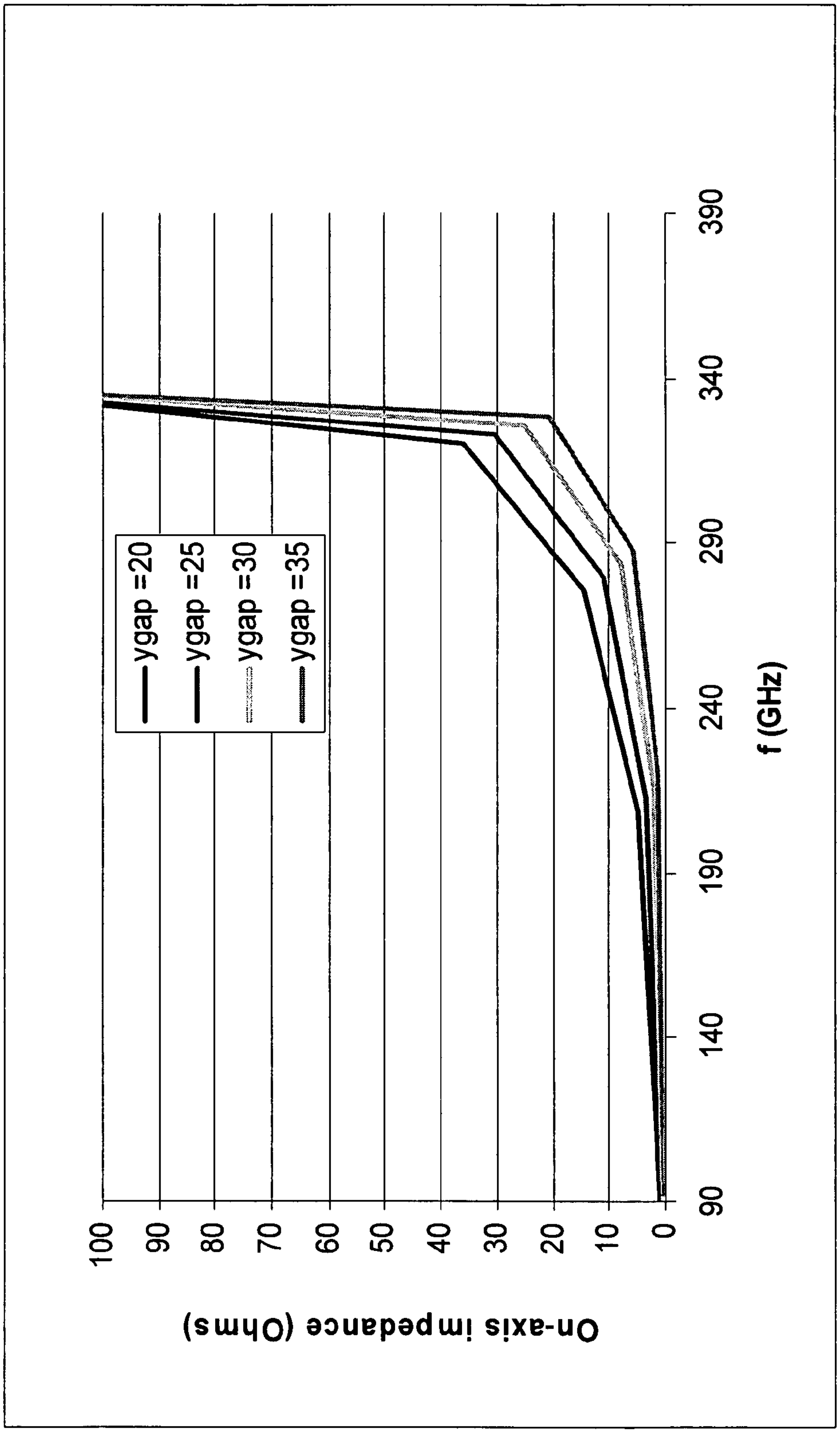
FIG. 5 shows the interaction impedance as a function of the height of the beam tunnel.

FIG. 5 shows the interaction impedance as a function of the height of the beam tunnel. Of particular interest is the variation of impedance as a function of ygap (see FIG. 3A) or the beam tunnel height. This crucial parameter defines the dimensions of the space through which the electron beam must pass. Impedance increases as the height of the gap decreases; a value of 25 microns was chosen as a compromise between efficient electromagnetic operation and the requirements of low beam interception. As will be discussed, the 25 micron dimension for ygap was compatible with the proposed design of the electron gun and the beam focusing system. The computations also showed that interaction efficiency increases as the beam tunnel height is reduced while beam interception is reduced as the tunnel height is increased.

FIG. 6 schematically represents an exemplary configuration for a backward wave oscillator according to one embodiment of the disclosure. This structure can be constructed, among others, with several lithographic steps. The process can be further simplified by modeling the electron gun and the slow wave circuit. For example, the stepped configuration in the electron gun and the collector insulators tend to reduce electrical breakdown along the dielectric surfaces. It will be shown later that the electron gun can be designed so that the electric field in the gun is approximately 20 V/mil (8 kV/cm), which is well below the classic threshold for this effect of 127 V/mil or 200 V/mil. This enables the electron gun insulator to have a smooth surface, simplifying the lithographic process used for fabricating the silicon molds. In addition, the embodiments provided herein enable the design of a much smaller BWO.

Referring to the exemplary miniature sub-mm BWO 600 of FIG. 6A, the face view shows cold cathode emitter 610 positioned at one end of the BWO 600 while the collector 680 is positioned at the opposite end. Using a cold cathode source such as Spindt-type, field emission cathode is optional and other electron emitting sources can be used without departing from the principles of the disclosure. The field emission cathode is a preferred choice because it can create much higher current density as compared with thermionic cathode. The secondary electron emission suppression cavity 630 is positioned proximal to the electron source. Its purpose is to prevent electrical breakdown due to cascading secondary emission long the diamond surface. In another embodiment, the electron gun is designed with smooth walls (thereby obviating the need for a suppression cavity.)

Conventional means can be used for coupling the electron source (e.g., electron gun) to the slow wave circuit. For example, the electron gun can be coupled to the slow wave circuit using mechanical means. In one embodiment, the entire electron gun and the slow wave circuit can be fabricated as one structure, eliminating problems of alignment.

The focusing lens 640 is placed at the output of the BWO to serve as the entry element for a quasi optical transmission system. The BWO can also be coupled to standard WR-3 waveguide by adapting conventional microwave techniques. The waveguide is not visible in FIG. 6.

The interdigital wave circuit 660 is shown as an integrated unit with fingers 625 protruding toward the center of the circuit. In one embodiment, the interdigital wave circuit (or slow wave circuit) is fabricated as complementary halves prior to its assembly. The body of the interdigital circuit can be fabricated from a material of exceptional thermal conductivity. Exemplary materials include synthetic diamond. Synthetic diamond is particularly suitable as it provides high thermal conductivity enabling efficient heat transmission. Diamond also has a high dielectric strength to withstand the electron gun voltages and very a low loss tangent to minimize RF losses.

To improve performance, certain surfaces of the interdigital circuit can be coated with electroconductive material such as gold, silver or copper. An optional coating layer can be interposed between the diamond structure and the conductive coating (e.g., Ag, Cr or Mo). The coating layer may be provided to enhance the bonding between gold and the diamond structure.

The secondary electron emission suppression cavity 630 is comprised of corrugated diamond, so constructed to interrupt cascading secondary electron emission from causing electrical breakdown. It can be fabricated at the same time as the electron gun and the slow wave circuit.

FIG. 7 shows the effect of the dispersion diagram resulting from the variation of the height of the dielectric fingers. The slope of this curve represents the group velocity of a wave propagating on the circuit while the slope of a straight line drawn from the origin to a point on the curve determines the phase velocity, the more steep the line, the higher the voltage. The point where the phase velocity line crosses the dispersion curve determines the operating point of the device and the electron velocity and, hence, the voltage of the electron beam.

FIG. 8 shows variation in attenuation due to finger height (see finger height 625 in FIG. 6). Referring to FIG. 8, it can be seen that the attenuation at higher frequencies is reduced by increasing the finger height. This is advantageous because it enables increasing this parameter to coincide with the height of the walls of the electron gun in order to eliminate one of the lithographic steps in the fabrication process.

The preceding Figures illustrate that group velocity becomes negative as the phase shift per cavity exceeds 60 to 80 degrees. Therefore, when the phase shift per cavity exceeds this value, the group velocity of the wave is traveling in the opposite direction to the electrons; hence, the term backward wave. The peak of the dispersion diagram generally represents a point of unstable operation. This is illustrated in FIG. 9 by the nearly vertical plots of impedance in the vicinity of the peak in the dispersion curves.

In an exemplary embodiment, the results of the parameter sweep were used to design a biplanar interdigital circuit to operate at 300 GHz with both 10 and 20% bandwidths optimized for impedance. The following dimensions were fixed during the design and optimization process:

ygap=25 microns vaneth=4 microns 0.5 ygap+vaneth+diht=100 microns; (diht=83.5 microns).

In addition, the maximum voltage was set at about 6000 V and the minimum phase shift per period at about 85 degrees. Two embodiments were completed, both with a center frequency of 300 GHz. The first had a 10% bandwidth operating from 285–315 GHz. The second embodiment had a 20% bandwidth operating from 270–330 GHz. The circuit dimensions for each exemplary design are listed below in Table 2 as follows:

TABLE 2

300 GHz biplanar interdigital circuit dimensions

| Parameter | 10% BW Design | 20% BW Design |
|---|---|---|
| vaneridge | 44.0 | 44.0 |
| vanew | 17.2 | 16.4 |
| vanel | 183.4 | 175.0 |
| vaneth | 4.0 | 4.0 |
| diridge | 87.5 | 87.5 |
| p | 34.4 | 32.8 |
| xS | 17.2 | 16.4 |
| zS | 22.3 | 21.3 |
| diht | 83.5 | 83.5 |
| ridgeht | 23.0 | 23.0 |
| ygap | 25.0 | 25.0 |

For the purposes of defining the electron beam requirements for the device and estimating efficiency and start oscillation current, the interaction impedance averaged over the electron beam (as described in Equations 1 and 2) can be computed. The average impedance was calculated as a function of beam width (in z-direction), while keeping the beam height (in y-direction) constant at about 12.5 microns. All simulations assumed a rectangular beam. The average impedance is plotted in FIG. 10 for the 10% bandwidth design as a function of beam width for several frequencies. Zero beam width corresponds to the on-axis impedance. The frequencies correspond to the values of $\beta L$=70, 80, 100 and 110 degrees. The 12.5 micron case is slightly higher than the on-axis case because the fields increase with proximity to the fingers. The impedance falls off rather slowly as beam width is increased indicating that the device can operate very efficiently with a rectangular or sheet beam.

The magnitude of the n=−1 space harmonic of the Ez field is plotted in FIG. 11 as a function of z for y between −6.25 and 6.25. The beam center is assumed to be at y=z=0. The field is symmetric in z, thus it is shown for only positive values of z. FIG. 12 shows the field versus y for values of z between 0 and 80 microns. Although the field increases at certain values of y with increased z, it also decreases for certain values of y with increased z. The result is that the average decreases with increasing z.

The approximate start oscillation conditions were also calculated. The start oscillation current is plotted in FIG. 13 for the 10% bandwidth design and in FIG. 14 for the 20% design as a function of total circuit length l. FIGS. 13–14 illustrate that for the 10 and 20% bandwidth design embodiments, limiting the beam current to 0.5 mA and the circuit length to 5 mm may be unsuitable. Furthermore, in order to reach maximum efficiency it may be necessary to operate at twice the start oscillation current. The circuit length may be extended optionally. The alternative of increasing the beam current may be more attractive from the standpoint of increasing efficiency as can be seen from FIG. 15, which shows the results of computations with 0.5 mA electron beams. From the results shown in FIGS. 13–14, it can also be seen that minimizing the length of the circuit can result in maximizing the electronic efficiency. For example, where 1 is about 5 mm, FIGS. 13 and 14 show that a current of about 1.5 mA may be needed to operate at twice the start current over the entire bandwidth. The electronic efficiency and output power are plotted for a 1.5 mA current in FIGS. 16–19. It can be seen that the narrow band design can deliver more power. The design database disclosed herein enables one of ordinary skill to determine the minimum circuit length for any value of beam current.

Electron Gun and Collector Design—The design of an electron gun capable of providing the current specified in the 300 GHz design above was performed using the EGUN Code (See "SLAC-166," W.B. Harmannsfeldt, Standford Linear Accelerator Center, 1973). The results are represented at FIGS. 21 and 22. The gun was designed to fit the specified dimensions and the limitations of the proposed fabrication process, which as a lithographic process allows only vertical and horizontal surfaces. s will be discussed in relation with FIG. 25, the electron gun can be designed to produce only horizontal and vertical surfaces. The gun was designed to operate immersed in a constant magnetic field. The design was also controlled by a limitation of voltage along the insulating surface within the vacuum of no more than 20 V/mil (8 kV/cm). Most importantly, to meet the exemplary operation conditions described above, the electron gun must pass a beam of 1.5 mA at voltages ranging from 1.8 kV to 6.6 kV through a beam tunnel only 25 microns high.

The cathode selected for the gun design was a Spindt-type thin film field emitter. This cathode type has demonstrated current densities as high as 2000 A/cm$^2$ for small arrays delivering low total currents. Emission of 100 $\mu$A from individual emitting tips has been observed; however, this is considerably diminished for large arrays of several thousand tips. The preceding analysis show that (i) reasonably uniform output power is available over the 10% and 20% bandwidths (FIGS. 18–19); (ii) field configuration is favorable for application of sheet electron beam (FIG. 11); (iii) higher output power and efficiency can be obtained with shorter circuit, but it will require a higher start oscillation current (FIGS. 13–19); (iv) higher interaction impedance and higher attenuation compete at high end of frequency band (FIGS. 8 and 9); and (v) higher frequency circuits are readily scaleable (FIG. 4).

The field emitter produces an electron beam with significant transverse velocity. It has been established that the transverse energy as an approximately Gaussian distribution with a FWHM value determined by the product of the gate voltage and a geometric factor normalized to a specific operating point. The emission model utilized is characterized by the emission curve shown in FIG. 20. The applications disclosed herein were conducted with the FWHM geometric factor referenced to 76 V, rather than 64. An emission model was constructed that contained 99% of the beam current and was introduced into the EGUN code. The beam was transmitted through a 25 micron beam tunnel. A minimum start oscillation current of 0.7 mA can be used for a 5 mm circuit length. The beam current can be doubled by increasing beam width without increasing current density or magnetic field.

In an embodiment according to the principles disclosed herein, the electron gun provides a beam of constant current over a voltage range of about 1.8 to 6.6 kV. The gun may also be formed as an integral part of the CVD diamond slow wave circuit body. An electron gun was designed with two anodes. The first anode is kept at a constant potential with respect to the cathode of the lowest voltage (1.8 kV in this case) so that electron emission is unaffected by variations in the beam voltage. The slow wave circuit serves as the second anode and its voltage varies from 1.8 kV to 6.6 kV with respect to the cathode.

The slow wave circuit analysis presented above called for an electron beam of 1.5 mA to achieve a minimum of two times the start oscillation current at all cases. After a large number of trials with EGUN, a cathode consisting of an array of 100 tips in a 2×50 configuration with 1.5 micron spacing was adopted. The spacing and the current per tip of 15 μA are both well within the parameters that are typically achieved by SRI. The oblong cathode makes use of the field distribution within the slow wave circuit to provide the required current while limiting the current density, which facilitates beam transmission. The slow wave circuit geometry would allow a cathode at least twice as wide as this if necessary. The field emitter must be diced to fit into the lithographically controlled dimensions formed by the end of the BWO body in order to accurately center the emitter in the gun for transmission through the slow wave structure. In one embodiment, the lithographically determined transverse dimensions of the BWO body serves to align the cathode. In another embodiment, the focus electrode can make contact with the gate and the base contact can be made at he rear of the cathode. The gun design is illustrated in EGUN generated drawings in FIG. 21, for the 1.8 kV embodiment and of FIG. 22 for the 6.6 kV embodiment.

The vertical scale in FIGS. 21–22 is exaggerated. The bottom of the figure is the centerline 2100 of the gun axis (2100 is pointing at the location of the field emission cathode). Because this structure and the electron beam are rectangular in shape, the model has been constructed using rectangular coordinates. Because EGUN is a two-dimensional code, the model can compute the effects of the vertical and axial dimensions; the model can be constructed with the transverse dimension extending to infinity. The current density is modeled as described above. FIGS. 21 and 22 can be better understood in relation with FIG. 23.

Referring to FIG. 21, the model simulates the electron beam trajectories in a low voltage, low frequency case where the first anode and the second anode are at approximately the same potential. In FIG. 21, 2100 identifies the cathode; 2114 shows the location of the focus electrode; 2113 is the first anode; 2116 is the dielectric space between the first anode and the second anode (interchangeably, slow-wave circuit); 2115 is the slow-wave circuit; vertical lines 2112 and 2117, respectively, represent equipotential lines between cathode and first anode and between slow-wave circuit and the collector; 2118 is the diamond dielectric standoff; 2121 points at the collector and 2120 designates the electron beam envelop. Finally, 2119 shows the insulation between the slow-wave circuit and the collector. In FIG. 21, the distance '½ ygap' is the distance between the bottom edge 2101 to the bottom of first anode 2113.

The envelope of the electron beam contains 99% of the beam current. The gun and slow wave circuit are immersed in a uniform field of 5000 Gauss. The focus electrode, the first anode and the circuit all share the same distance from the centerline, which is ½ ygap (see also FIG. 3). Similarly, the top line of FIGS. 21–22 is at a distance from the centerline equal to ½ ygap+diht+vaneth=100 microns. FIG. 22 represents a similar simulation as in FIG. 21 except that in FIG. 22 the 6600 V, high frequency embodiment is shown.

The cathode can be mounted at the left of FIGS. 21–22 and can be placed against the focusing electrode that provides electrical contact to the cathode gate and serves to shape the electron beam. In both FIGS. 21 and 22, the focus electrode can be positioned at the extreme left of the Figs. while the collector can be positioned at the right end.

In one embodiment, the focus electrode of the gun can make contact with the gate of the field emitter and the back of the field emitter can define the base connection. The collector is not formed lithographically, and therefore, can be designed as a reentrant structure to enhance the capture of the spent beam. The collector is attached to the diamond insulating surface at the extreme right of the figure. The collector has been biased to 90% of the cathode to circuit potential. The controlling magnetic field can carry the electron beam through the slow wave circuit and into the collector. The collector can be fabricated from isotropic (POCO) graphite, which is commonly used in the fabrication of space traveling-wave tubes (TWT), because of its very low secondary electron yield. The collector may be simply a piece of graphite with a large aspect ratio hole or it might be two pieces of flat graphite with, for example, 50 V bias for suppressing secondary electrons.

Magnetic Circuit—In one embodiment, the magnetic field can receive the electron beam with two parallel bar magnets to allow the electrical connections to the BWO and the RF output to come through the sides of the structure. The magnetic circuit can be formed by two rectangular bar magnets with iron pole pieces at each end and supported by an aluminum or stainless steel framework. A view of an exemplary embodiment of the component parts of the BWO electron gun, magnets, slow wave circuit and collector is shown in FIG. 23. Referring to FIG. 23, the exploded view shows bar magnets 3010 having interposed between them mating biplanar interdigital structures (circuits) 3040. Spindt cathode 3030 is positioned opposite the collector 3020 to provide electron beam (not shown). In one embodiment, the magnets are supported by a non-magnetic frame (not shown) that centers the BWO within the magnetic field. The magnetic material can be made thicker to increase the magnetic flux. In another embodiment, the minimum spacing between the magnets can be 2.5 mm, which would accommodate a short section of standard WR3 waveguide.

Referring to the embodiment of FIG. 23, a mounting structure is formed on the mating bi-planar structures 3040. In one embodiment, the structure is fabricated as complementary halves and then combined to form a BWO. Referring to the exploded view of FIG. 23, a diamond dielectric standoff 3011 is shown between focus electrode 3009 and first anode 3012. The dielectric insulation between first and second anode is identified as 3013. Slow wave circuit 3015 is shown as having a plurality of interdigital structures (fingers) coated with a conductive material. The slow-wave circuit 3015 can also act as a second anode. The frequency of the oscillator can be controlled by varying the voltage difference between the first anode and the slow-wave circuit. Bar magnets 3010 receive the assembled BWO which, in the exemplary embodiment of FIG. 23, includes Spindt Cathode 3030 and Collectors 3020. The lower the potential difference between the first and second anode, the lower the frequency of the oscillator.

With reference to the assembled view of FIG. 23, after the electrons pass through the complementary structures of first anode 3011 and slow-wave circuit 3015, they are captured by collector 3020. The collector 3020 can be biased to be closer in potential to the cathode than to the first or second anodes. As the electrons impact collector electrodes 3020, little heat is generated and much of the power of the electron beam is captured by the collectors 3020. In an exemplary embodiment, the Spindt cathode is receives −6.6 kV, first anode is set to −4.8 kV and slow-wave circuit 3015 is grounded to zero potential. The embodiment shown in FIG. 23 is particularly advantages over the conventional devices in that it is substantially smaller. In one embodiment, the device is measured to be about 30 gm. (conventional devices are about 20 kg).

A calculation demonstrating feasibility of achieving the required magnetic field and to provide an estimate of the magnet weight was performed using the MAXWELL code (Maxwell, Ansoft Corporation, Pittsburgh, Pa. The weight of the magnetic circuit was found to be approximately 29 grams. The magnetic field achieved by this exemplary configuration is demonstrated in FIG. 24. Specifically, FIG. 24(A) shows the magnetic fields generated by a pair of NdFeB 50 bar magnets 18 mm long, 5.0 mm wide and 5.25 mm thick and separated by 2.5 mm. Only the fields between 0.35 and 0.75 Tesla (3500–7500 Gauss) are depicted in the contour plot of FIG. 24A. FIG. 24B shows the magnetic field on axis.

Additional computations were conducted to design a miniature 300 GHz backward wave oscillator, voltage tunable over a frequency range of at least 10% with a power output of at least 10 mW. As a result of the experiments, it was discovered that a power output in excess of 20 mW can be obtained over a 20% tuning range at 300 GHz with a power input of less than 1.275 W. For these experiments, the circuit was analyzed using both SmCo28 (a material typically used in the tube industry) and NdFeB50 as permanent magnets. Ordinary vacuum devices reach relatively high temperatures in operation, requiring the use of a magnetic material such as SmCo, which has excellent temperature stability. However, the low heat dissipation for the diamond BWO will cause negligible heating of the magnetic circuit. NdFeB provides higher magnetic fields, greater mechanical strength and can be produced in larger forms than SmCo. It is useable at temperatures up to 200 C and is frequently employed in automotive applications.

Fabrication—Exemplary processes for fabricating a backward wave oscillator suitable for use with the instant disclosure have been disclosed in U.S. patent application Ser. No. 10/772,444 filed Feb. 6, 2004 (entitled "Free-Standing Diamond Structure and Methods") the disclosure of which is incorporated herein in its entirety for background information.

FIG. 25 shows an exemplary circuit fabrication process according to one embodiment of the disclosure. Step 1 in FIG. 25 is to create a silicon negative of the diamond structure. This can be accomplished, among others, by utilizing silicon on insulator (SOI) wafers. An SOI wafer is a silicon wafer in which a layer of silicon dioxide has been imbedded. The depth of the oxide layer can typically be controlled over a wide range of dimensions to a tolerance of one micron (or another desired tolerance). Using lithography, the wafers can be patterned as shown in Step 1 to create a two level silicon structure. The oxide layer can be used as a stop etch layer which can result in a smooth surface uniformly distributed across the wafer on which to deposit the chemically vapor deposited (CVD) diamond in step 2. It will be possible to produce a large number of silicon molds with a single lithographic operation.

The diamond can be deposited on the silicon mold in Step 2. The diamond will be supported structurally by a coating of epoxy applied in Step 3, and in Step 4 the silicon substrate will be etched away chemically to reveal the diamond structure. The three-dimensional Bi-Planar Interdigital structures may be selectively metallized. The surfaces requiring metallization are shown in FIG. 25. The metallization will be performed with a physical vapor deposition process. Masking techniques can be used to ensure that the vertical surfaces of the interdigital circuit and the horizontal base of the entire structure remain free of metallization.

Masking the base of the structures from evaporant can be achieved by applying a physical shadow mask before deposition. The focus electrode—$1^{st}$ anode spacing (2.4 mm) and the $1^{st}$ anode—$2^{nd}$ anode spacing (5.4 mm) allow the use of a physical shadow mask in these areas. The shadow mask placement can be performed with the use of a microscope to ensure complete coverage of the base. The use of a physical shadow mask can result in some deposited material on the base which will be removed after deposition with a laser.

The vertical walls and horizontal base area of the slow wave circuit may also remain free of metallization. The spacing between the digits in the slow wave circuit prevents the use of a shadow mask or a spun on photo mask. To ensure the region below the top surface of the slow wave circuit remains free of metallization the deposition will be performed by either sputter deposition or resistive evaporation in a background of Ar gas, for example, with a partial pressure of about $10^{-3}$ Torr. Deposition in Ar at an elevated pressure range will accomplish the complete coating of three dimensional structures such as the focus electrode and $1^{st}$ and $2^{nd}$ anode while preventing the coating of the area within the slow wave circuit below the top surface. It is well known that physical vapor deposition performed in an elevated pressure environment results in conformal coating of three dimensional structures. Simultaneously, the interdigital spacing in the slow wave circuit is less than the required minimum spacing to allow evaporant to penetrate the region.

Deposition of metal in an elevated background may result in a reduced density metal layer and potentially poor adhesion. It may be necessary to apply a DC bias in the 1–3 kV range during deposition in the elevated Ar background to achieve an ion-plating effect. This will ensure good adhesion of the metal layer to the diamond interdigital structure surface. It may be necessary to deposit an interlayer of Cr to promote adhesion.

Step 6 shows the joining of the circuit halves. This process can be done with liquid crystal fabrication technology. The two circuit halves are brought into close proximity and aligned using stepping motor driven fixtures. For highly developed manufacturing processes, such as computer displays, tolerances of 3 microns can be maintained over 15 inches. In one embodiment, the two structures are then joined using high tack, low out-gassing, UV cured glues that have been developed in the industry for this particular purpose. The glue can be applied using a silk screening or offset printing process. For the small structures required for the BWO circuits, alignment tolerances of less than one micron are predicted. For high volume production, tooling for improved tolerances can be obtained. In one embodiment, the electron gun can be manufactured as an integral part of the slow wave circuit while in another embodiment, the electron gun may be attached after the slow wave circuit has been assembled.

A matching silicon structure may be processed to produce a mating CVD diamond circuit half. Two circuit halves with identical spacing between levels as shown in Step 1 will not produce the desired structure. As shown in Step 6 there can be a spacer between the circuit halves. To achieve the desired dimensions, the spacer can be equal to the height of the beam tunnel plus twice the metallization thickness. This will be accomplished by processing a two layer SOI wafer to produce a three layer silicon mold for the other circuit half. In one embodiment, the BWO is operated inside a vacuum chamber. In another embodiment both halves are fabricated from two layer SOI wafers for purposes of symmetry and to gain the advantage of fabricating them from the same wafer in the same lithographic process. In another embodiment, the BWO is configured to have a vacuum tight structure with diamond walls.

The fabrication procedures described above are a significant departure from conventional vacuum electron device technology, which are based in part on the high vacuum requirements imposed by thermionic electron sources that are easily poisoned by trace contaminants. Conventional devices also handle relatively high power and must tolerate high temperatures. The BWO embodiments disclosed here can dissipate at most approximately one Watt of power and will utilize a field emission cathode which is not as susceptible to poisoning. The power that is dissipated will be conducted from the device using diamond, the highest thermal conductor known. While typical vacuum electronic devices operate at high temperatures, the embodiments disclosed herein can be essentially at ambient temperature. The materials that will be in vacuum are all compatible with that environment. The backward wave oscillator can require high voltage for its operation, which will require maintaining sufficient vacuum to prevent gaseous breakdown.

FIG. 26 illustrates a cross-sectional area showing metalization pattern according to one embodiment of the disclosure. Appropriate masking techniques can be applied to create the necessary patterns.

FIG. 27 is a schematic representation of a section of biplanar slow wave circuit according to one embodiment of the disclosure. Referring to FIG. 27, BWO 2700 is shown to have biplanar interdigital circuit 2710. In one embodiment, each plane of the biplanar interdigital circuit comprises diamond. Also shown in FIG. 27 is, conductive coating 2720 deposited on the fingers of the interdigital circuit. While various coating compositions can be used for this application, in one embodiment the coating is gold, silver, copper, chromium or a composite thereof.

Figure 28A:
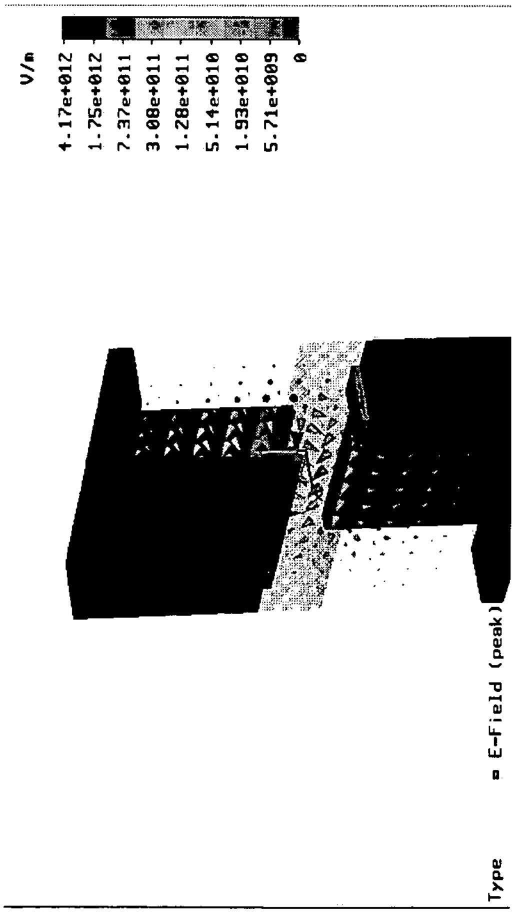
Figure 28B:
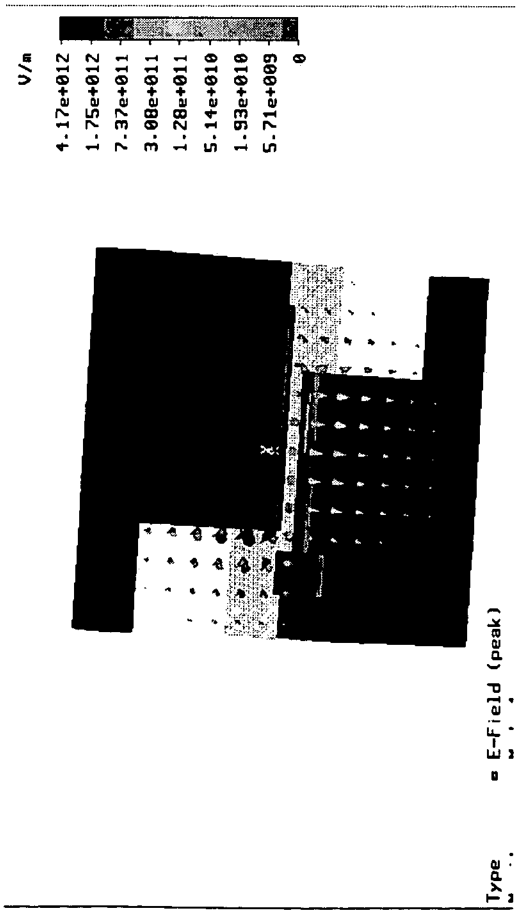
Figure 28C:
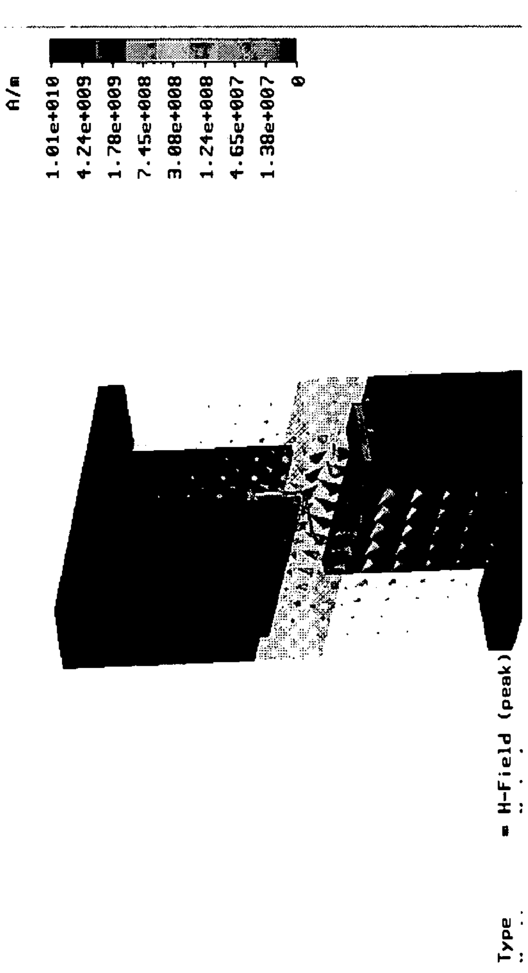
Figure 28D:
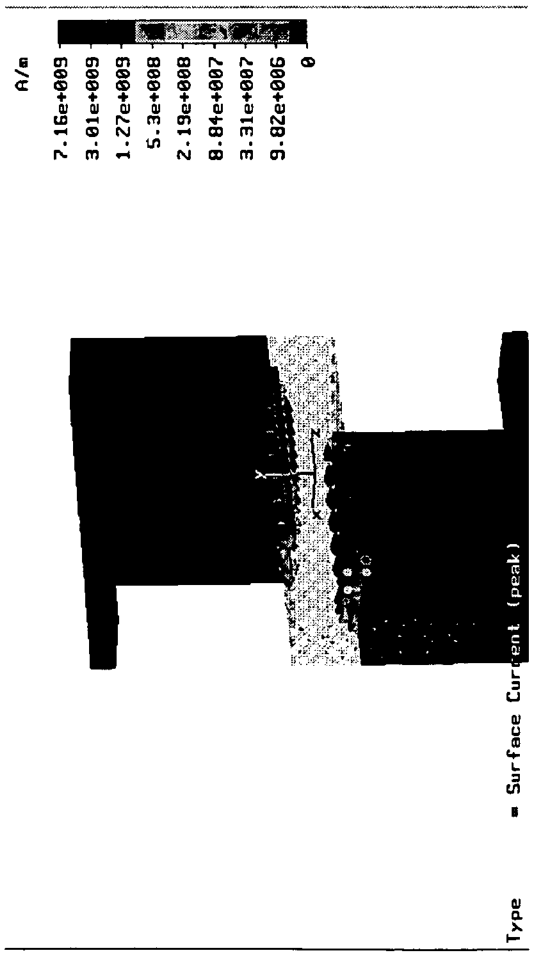
Figure 28E:
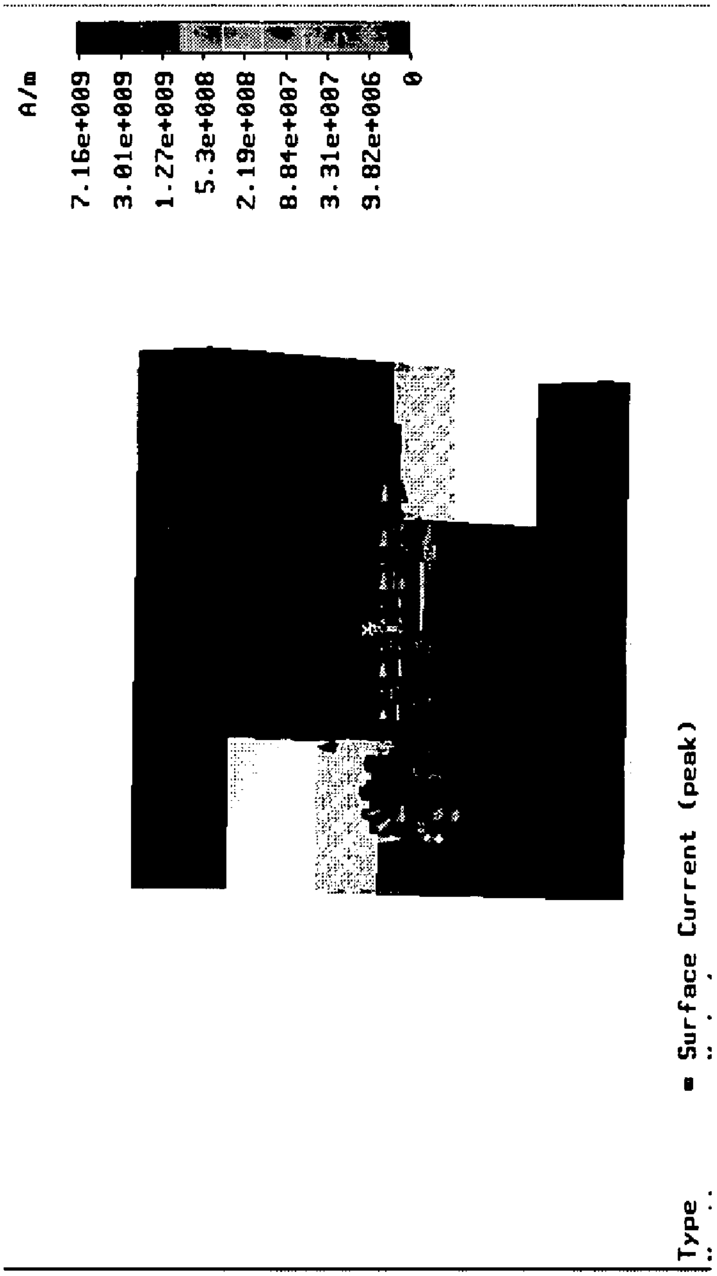

FIGS. 28A–E show arrow plots of the electrical and magnetic fields and the surface currents for a single period of the interdigital circuit shown in FIG. 27. FIGS. 28A–B show the electric fields from different perspectives, FIG. 28C shows the magnetic fields, and FIGS. D and E show the surface currents from different perspectives. Finally, FIG. 29 is a contour plot of the surface currents in a single period of the interdigital circuit according to another embodiment of the disclosure.

Manufacturing Tolerances and Gold Undercut—In depositing the gold film on the circuit fingers (see Step 5 of FIG. 25) it may be desirable not to allow the metal to deposit on the sides of the fingers. An undercut of metal on the edges of the fingers can be considered. The undercut was assumed to be 0.5 microns on each side. A top view of the circuit with undercut is shown in FIG. 30 indicating the location of the undercut edges. The undercut is exaggerated (2 microns) in FIG. 30 in order to demonstrate the position of the undercutting. The effect of the predicted undercut of 0.5 micron may be insignificant.

Power Balance—The extremes of power balance for the 300 GHz backward wave oscillator are presented in Table 3 below for the 10% bandwidth embodiment. While the power output is relatively uniform over the frequencies, the DC power input and RF losses changed over the same range of frequencies.

TABLE 3

Study of typical power balances for 20% BW embodiment.

| | Low Frequency (1.8 kV) | High Frequency (6.6 kV) |
|---|---|---|
| Power Output | 20 mW | 26 mW |
| RF Losses | 39 mW | 191 mW |
| Beam Interception (1%) | 27 mW | 99 mW |
| Collector Dissipation (90% depression) | 261 mW | 958 mW |
| Total Dissipation (Efficiency) | 327 mW (5.8%) | 1.248 W (2.0%) |

A typical power balance of an exemplary embodiment is as follows:

Power output is 24 mW at 1.8 kV and 30 mW at 6.6 kV;

RF circuit losses are 53 mW at 1.8 kV and 137 mW at 6.6 kV;

Beam interception (1%) is 27 mW at 1.8 kV and 99 mW at 6.6 kV;

Collector dissipation (90% efficiency) is 260 mW at 1.8 kV and 963 mW at 6.6 kV;

Total power dissipated is 340 mW at 1.8 kV and 1.199 w at 6.6 kV;

Overall efficiency is 6.6% at 1.8 kV and 2.4% at 6.6 kV.

Design of a 600 GHz BWO—The principles disclosed herein with respect to the 300 GHz design were repeated for 10 and 20% bandwidth BWO's centered at 600 GHz. The dimensions of the 600 GHz case as shown in Table 4 were nearly half of the 300 GHz design shown in Table 2. However, the cathode used is exactly the same as for the 300 GHz case. The twice start oscillation current for the worst case is about 1.8 mA. About 99% of the beam can be contained within the beam tunnel but the magnetic field must be increased to 9000 Gauss.

TABLE 4

The 600 GHz Circuit Dimensions (microns)

| Parameter | 10% BW | 20% BW |
|---|---|---|
| Vaneridge | 22.0 | 21.9 |
| Vanew | 8.6 | 8.2 |
| Vanel | 91.7 | 87.5 |
| Vaneth | 2.0 | 2.0 |
| Diridge | 43.8 | 43.8 |
| P | 17.2 | 16.4 |
| Xs | 8.6 | 8.2 |
| Zs | 11.2 | 10.7 |

TABLE 4-continued

| The 600 GHz Circuit Dimensions (microns) | | |
| --- | --- | --- |
| Parameter | 10% BW | 20% BW |
| Diht | 41.8 | 41.8 |
| Ridgeht | 11.5 | 11.5 |
| Ygap | 12.5 | 12.5 |

The development of a field emission cathode with on chip focusing to reduce transverse velocities can enhance this design.

Although the principles of the disclosure have been disclosed in relation to exemplary embodiments, it is noted that the principles of the disclosure are not limited thereto and the principles include any permutation or variation not specifically disclosed herein.

What is claimed is:

1. A portable backward wave oscillator for providing oscillations at a sub-millimeter wavelength comprising:

an electron beam generator comprising a directional source of electrons, a collector of electrons, and means for accelerating electrons emitted from said source in the direction of said collector;

magnetic field focusing means for focusing the beam of electrons;

a slow wave circuit disposed intermediate said source and said collector, said circuit having a bi-planar, interdigital, periodical geometric structure of synthetic diamond with the surfaces adjacent the beam being overlaid by gold, the interdigital structure including two sets of digits, each set in a different plane, said electron beam passing between said two planes to thereby interact with the full propagation strength of the electro-magnetic energy induced in said slow wave circuit by said beam; and a control circuit for electrically tuning the frequency of the oscillations.

2. The backward wave oscillator of claim 1 having a size and weight acceptable for hand held operation.

3. The backward wave oscillator of claim 1 including a circuit for decelerating the electrons from said source that were accelerated in the direction of said collector after such electrons have passed said slow wave circuit; and wherein the voltage of said collector is depressed relative to the voltage of said source.

4. The backward wave oscillator of claim 1 wherein said planes are parallel.

5. A portable, backward wave oscillator for providing oscillations at a sub-millimeter frequency comprising:

an electron beam generator comprising a source of electrons, a collector of electrons, and means for accelerating electrons emitted from said source toward said collector;

a slow wave circuit disposed intermediate said source and said collector through which the electron beam passes, said circuit having a bi-planar, interdigital, periodical geometric structure of an electrically non-conducting material with the surfaces adjacent the beam being metalized;

a magnetic field focusing circuit for focusing the beam of electrons; and a control circuit for electrically tuning the frequency of the oscillations.

6. The oscillator of claim 5 wherein said source of electrons is directional.

7. The oscillator of claim 5 wherein said control circuit includes means for selecting the voltage of said source.

8. The oscillator of claim 5 wherein said focusing circuit substantially prevents the focused beam from striking said slow wave circuit.

9. The oscillator of claim 5 wherein the electron beam passes between the two planes of said bi-planar slow wave circuit.

10. The oscillator of claim 5 wherein said interdigital circuit includes a set of digits in each of two different planes.

11. The oscillator of claim 10 wherein the planes are parallel.

12. The oscillator of claim 5 wherein the electron beam passes through the full propagation strength of the electro-magnetic energy induced in said slow wave circuit by the beam.

13. The oscillator of claim 5 wherein the non-conducting material of said structure is diamond.

14. The oscillator of claim 13 wherein the diamond is synthetic.

15. The oscillator of claim 5 wherein the metal for the metalized surfaces is selected from the group consisting of gold, silver, platinum, and copper.

16. A device for providing sub-millimeter wavelength electro-magnetic oscillations comprising an electron beam generator, a magnetic field focusing means for focusing the electron beam and a slow wave circuit, wherein the electron beam interacts with the full propagation strength of the electro-magnetic oscillations and wherein the device weighs less than about 500 grams and operates with an efficiency greater than about one percent.

17. In a device for providing electro-magnetic oscillations comprising an electron beam generator, magnetic field focusing means for focusing the electron beam and a slow wave circuit having an interdigital structure of an electrically non-conducting material with metalized surfaces adjacent the beam, the improvement wherein said non-conducting material is synthetic diamond.

18. The device of claim 17 wherein the oscillator is a sub-millimeter backward wave oscillator.

19. In a device for providing electro-magnetic oscillations comprising an electron beam generator, magnetic field focusing means for focusing the electron beam and a slow wave circuit having an interdigital structure of an electrically non-conducting material with metalized surfaces adjacent the beam, the improvement wherein said non-conducting material is a synthetic material.

20. The device of claim 19 wherein said material is diamond.

21. The device of claim 19 having a size and weight acceptable for hand held operation and an efficiency greater than about one percent.

22. In a device for providing electro-magnetic oscillations comprising an electron beam generator, magnetic field focusing means for focusing the electron beam and a slow wave circuit and a collector, the improvement including a circuit for decelerating the electrons from said source that were accelerated in the direction of said collector after such electrons have passed said slow wave circuit and the depressing of the voltage of said collector relative to the voltage of said source.

23. The device of claim 22 wherein the oscillator is a backward wave oscillator and is portable.

24. The device of claim 22 wherein said slow wave circuit is bi-planar and comprised of synthetic material.

25. A backward wave oscillator for providing oscillations at a sub-millimeter wavelength, said oscillator having a size and weight acceptable for hand held operation and producing at least one milliwatt of power at an efficiency of at least one percent comprising:

an electron beam generator comprising a directional source of electrons, a collector of electrons having a voltage depressed relative to the voltage of said source, and means for accelerating electrons emitted from said source in the direction of said collector and for decelerating the electrons from said source after such electrons have passed said slow wave circuit;

a slow wave circuit disposed intermediate said source and said collector, said circuit having a bi-planar, interdigital, periodical geometric structure of synthetic diamond with the surfaces adjacent the beam being overlaid by a metal selected form the group gold, silver and copper, the interdigital structure including two sets of digits in different but parallel planes, said electron beam passing between said two parallel planes to thereby interact with the full propagation strength of the electro-magnetic energy induced in said slow wave circuit by said beam; and magnetic field focusing means for focusing the beam of electrons to substantially prevent the impact of the beam with said slow wave circuit a voltage control circuit for electrically tuning the frequency of the oscillations.

26. In a device for producing electro-magnetic oscillations at a sub-millimeter wavelength comprising an electron beam generator for inducing electro-magnetic oscillations in an associated interdigital slow wave circuit, the improvement wherein the electron beam interacts with the full propagation strength of the induced electro-magnetic oscillations.

27. The device of claim 26 having a size and weight acceptable for hand held operation.

* * * * *